(12) United States Patent
Mao et al.

(10) Patent No.: US 10,708,011 B2
(45) Date of Patent: Jul. 7, 2020

(54) EYE OPENING HARDWARE OFFLOADING

(71) Applicant: SK Hynix Inc., Gyeonggi-do (KR)

(72) Inventors: Jinliang Mao, Milpitas, CA (US); Chee Hoe Chu, Cupertino, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 16/264,305

(22) Filed: Jan. 31, 2019

(65) Prior Publication Data
US 2019/0305898 A1 Oct. 3, 2019

Related U.S. Application Data

(60) Provisional application No. 62/649,492, filed on Mar. 28, 2018.

(51) Int. Cl.
*H04L 1/20* (2006.01)
*G01R 31/317* (2006.01)

(52) U.S. Cl.
CPC .......... *H04L 1/203* (2013.01); *G01R 31/3171* (2013.01); *H04L 1/205* (2013.01)

(58) Field of Classification Search
CPC ......... H04L 1/203; H04L 1/248; H04L 1/205; G01R 31/3171
See application file for complete search history.

(56) References Cited

U.S. PATENT DOCUMENTS

| | | | |
|---|---|---|---|
| 7,165,128 B2 | 1/2007 | Gadre et al. | |
| 8,260,572 B2 | 9/2012 | Tsubamoto | |
| 10,014,907 B2 | 7/2018 | Choi et al. | |
| 2002/0060820 A1* | 5/2002 | Buchali | H04B 10/07953 398/202 |
| 2004/0086034 A1* | 5/2004 | Jungerman | H04L 1/203 375/224 |
| 2008/0175341 A1* | 7/2008 | Sato | H04L 25/062 375/371 |
| 2013/0091392 A1* | 4/2013 | Valliappan | H04L 7/0331 714/700 |
| 2015/0331611 A1 | 11/2015 | Hansen et al. | |
| 2018/0046804 A1 | 2/2018 | Lee et al. | |

* cited by examiner

*Primary Examiner* — Syed Haider
(74) *Attorney, Agent, or Firm* — Kilpatrick Townsend & Stockton LLP

(57) ABSTRACT

An apparatus for determining an eye mask of a device under test (DUT) which is configured to receive a data bit stream signal including a threshold level value and output a data bit stream output signal. The apparatus includes an input unit configured to receive the data bit stream output signal provided by the DUT, an evaluation unit configured to evaluate the received data bit output signal and provide an evaluation result, and a controller configured to change the threshold level value in response to the evaluation result. The apparatus is integrated into the DUT and can operates autonomously without multiple interactions with a tester.

18 Claims, 16 Drawing Sheets

EYE OPENING HARDWARE OFFLOADING

CROSS-REFERENCES TO RELATED APPLICATIONS

This application claims priority to U.S. Provisional Patent Application No. 62/649,492, entitled "AUTONOMOUS HARDWARE EYE OPENING CALCULATION," filed Mar. 28, 2018, the disclosure of which is hereby incorporated by reference in its entirety for all purposes in the present disclosure.

FIELD OF THE INVENTION

The present invention relates generally to a communication interconnect architecture, and more particularly to an apparatus, a semiconductor device, and a method of autonomously determining or calculating an eye mask of a receiver device without multiple interactions between the receiver device and a tester.

BACKGROUND

In PCIe (Peripheral Component Interface express) and other high speed SerDes (Serializer-Deserializer) links, the receiver eye opening tolerance range is a key analog design feature. In general, external equipment is needed to generate a constrained signaling to a receiver and to evaluate the receiver data receiving performance. For example, a tester applies a test pattern (bit stream) to a device under test (a receiver), which sends the test pattern back to the tester for determining the bit error rate, i.e., the performance of the device under test (the receiver).

Generally, a bit error rate (BER) of an interconnect or link is a key indicator of a communication system. To determine the BER of a link or the performance of a device under test (DUT), an eye mask measurement is generally performed. The eye mask measurement is performed at an input of the device under test. However, an eye mask measurement at a close proximity of an DUT input with external test equipment is difficult and requires multiple firmware interactions between the DUT and the external test equipment. In addition, external test equipment is generally expensive and has limited use.

The present invention provides technical solutions to overcome the complex and inefficient firmware interactions.

SUMMARY

Embodiments of the present disclosure provides apparatuses, devices and methods for determining an eye mask of a device under test.

According to one embodiment, an apparatus for determining an eye mask of a device under test (DUT) which is configured to receive a data bit stream signal including a threshold level value and output a data bit stream output signal. The apparatus may include an input unit configured to receive the data bit stream output signal provided by the DUT, an evaluation unit configured to evaluate the received data bit output signal and provide an evaluation result, and a controller configured to change the threshold level value in response to the evaluation result.

According to another embodiment, an apparatus for determining an eye mask of a device under test (DUT) which configured to receive a data bit stream signal and output a data bit stream output signal. The apparatus may include an input unit configured to receive the data bit stream output signal provided by the DUT, a first threshold setting unit configured to provide a first threshold value to the data bit stream signal, a second threshold setting unit configured to provide a second threshold value to the data bit stream signal, a first evaluation unit configured to evaluate the data bit stream output signal and output a first evaluation result, a second evaluation unit configured to evaluate the data bit stream output signal and output a second evaluation result, and a controller configured to adjust the first threshold value and the second threshold value in response to the first evaluation result and the second evaluation result.

Embodiments of the present disclosure also provide a method for determining an eye mask of a device under test (DUT), which is configured to receive a data bit stream input signal having an added threshold signal level and output a data stream output signal. The method may include receiving the data stream output signal provided by the DUT, evaluating the received data stream output signal, and iteratively adjusting the threshold signal level in response to the evaluation in response to the evaluation result by an evaluation unit.

In one embodiment, iteratively adjusting the threshold signal level may include increasing an initial threshold level at a fixed increment until a first error condition is determined, then decreasing the initial threshold level at a fixed decrement level until a second error condition is determined. In one embodiment, the method may further include storing a last incremented threshold value associated with the first error condition and a last decrement threshold value associated with the second error condition in corresponding registers. The difference or distance between the last incremented threshold value and the last decremented threshold value is the height of the eye mask.

The following description, together with the accompanying drawings, will provide a better understanding of the nature and advantages of the claimed invention.

BRIEF DESCRIPTION OF THE DRAWINGS

The accompanying drawings form a part of the present disclosure, that describe exemplary embodiments of the present invention. The drawings together with the specification will explain the principles of the invention.

DETAILED DESCRIPTION OF THE INVENTION

Figure 1:
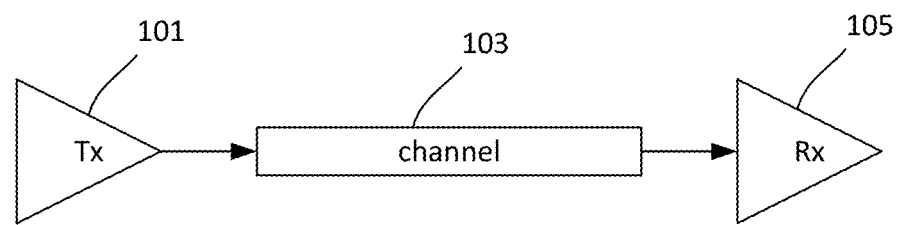
FIG. 1 shows a communication system that can be used for the description of embodiments of the present disclosure.

Firmware sequences for calculating or measuring an eye mask include injecting noises within a voltage range having discrete voltage values in a number of steps, running a test during a certain time period, then checking a result of a receiver behavior error count. If the error count is lower than a threshold count value, the voltage noises in the number of steps are considered to be acceptable. The firmware sequences then increase the number of steps, restarts the test again, until the error count is larger than the threshold error count value.

Similar steps will be performed for the jitter in the time domain having adjustable time values in a range of steps. Firmware sequences include injecting jitter in the time domain, running a test during another time period that is the same or different from the certain time period as the voltage noise test, then checking a result of a receiver behavior error count until the error count is larger than the threshold error count value.

The threshold error count value and the test time period can be set to be a large value or a small value to obtain a real bit error rate (BER), e.g., a BER of 1E-12 for an eye opening, or to obtain a quick evaluation result on the test system. During the entire test cycle, a conventional firmware-dedicated processor or a firmware module reads from and writes to registers, and waits idly until the test sequences are completed and reads the test results. As a result, the firmware-dedicated processor or the firmware module is dedicated to operate and execute the eye opening test program during this entire test cycle and not able to perform other operations.

Eye Opening Scanning

According to embodiments of the present invention, an eye-opening scanning module can provide this capability to autonomously measure or calculate the eye opening of a receiver (e.g., of a PCIe PHY receiver) without disturbing the receiver itself.

In accordance to the present invention, both the eye height and the eye width are programmable. An error count calculation period, i.e., the time period from starting the eye mask test to the time to check an error count is also programmable.

In some embodiments, an eye-opening scanning module integrated in a receiver (e.g., a PCIe PHY receiver) may sample multiple points concurrently (at the same time). In other embodiments, an eye-opening scanning module integrated in a receiver may sample one point at a time either in the voltage domain or in the time domain.

Error Count and BER of 1E-12

Many transmission and communication standards define the channel model and set limits for jitter at a certain bit error rate (BER). For example, the PCIe specification defines a BER requirement of 1E-12 ($10^{-12}$), which corresponds to receiving 10E12 ($10^{12}$) bits without errors, whereas some other communication specifications have other BER requirements. To speed up an eye opening calculation, an eye-opening scanning module often provides less strict requirements. For example, to calculate a BER of 1E-12, some testers require 30 minutes. To calculate a BER of 1E-15, the test time can typically take several days. For simple eye opening tests, it is impractical to spend such a long time to obtain an accurate eye opening value. Instead, a BER of 1E-9 or lower can be used to calculate the eye opening value. This value is generally sufficient to determine the difference between good and poor performance devices and systems.

Eye Opening Test Procedure

FIG. 1 is a communication system 10 that can be used for the description of embodiments of the present disclosure. The communication system 10 includes a transmitter (Tx) 101, a channel 103, and a receiver (Rx) 105. The transmitter 101 is configured to transmit a data bit stream to the receiver 105 via the channel 103. The data bit stream may be distorted and attenuated by the channel 103 which may be a wired connection having a limited bandwidth and noises. The receiver 105 is configured to process the distorted and attenuated data bit stream to generate a recovered data bit stream.

Figure 2:
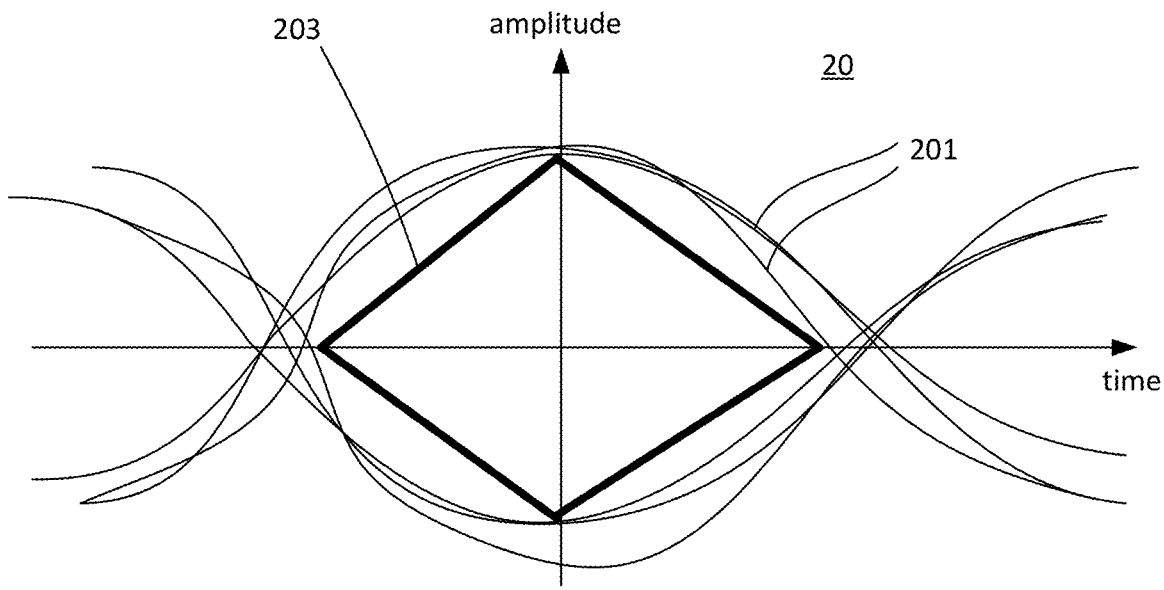
FIG. 2 shows an example of an eye pattern that may be used to characterize a communication system according to an embodiment of the present disclosure.

FIG. 2 is an example of an eye pattern 20 that may be used to characterize a communication system (e.g., the communication system 10) according to an embodiment of the present disclosure. The eye pattern 20 may be obtained by superimposing waveforms 201 of a data bit stream including a sequence of bits. The vertical axis corresponds to amplitude and the horizontal axis corresponds to time. When a waveform for a cycle of the data bit stream is smaller than an eye opening 203, it will be inside the eye opening. Thus, the eye opening 203 may be specified to provide a margin of a bit error rate (BER) associated with the communication system. The terms "eye mask," "eye opening," or "eye pattern" are used interchangeably herein.

Figure 3:
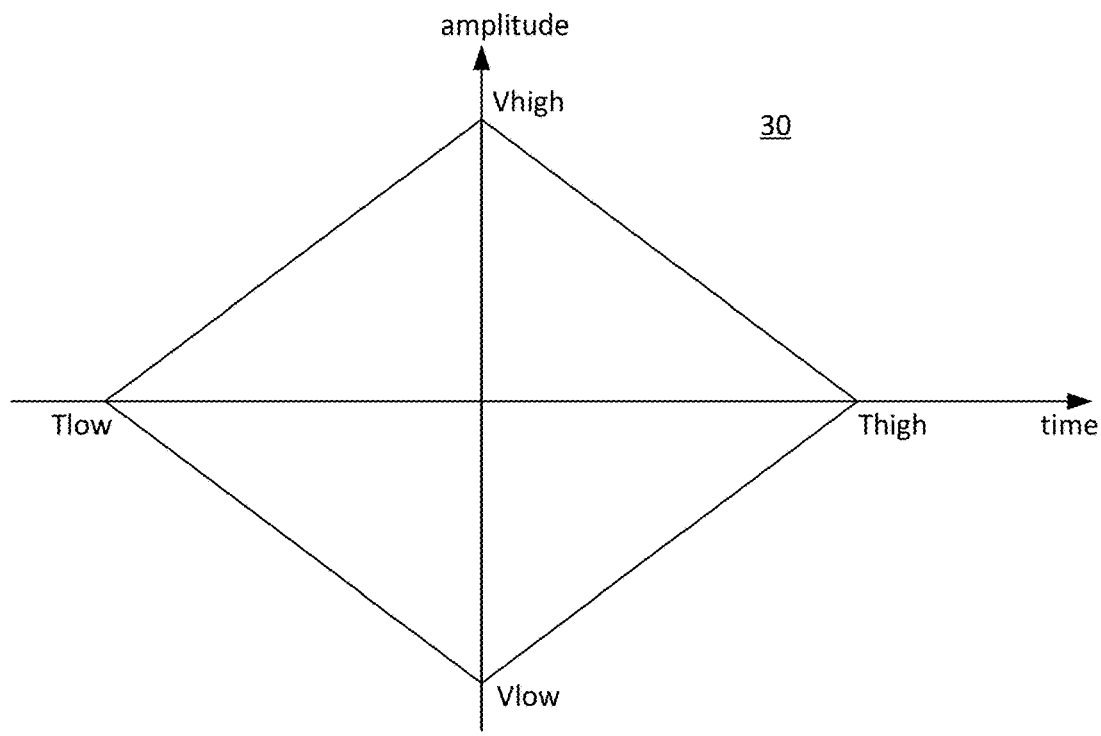
FIG. 3 shows an eye mask to qualify a communication system according to an embodiment of the present disclosure.

FIG. 3 is an eye mask 30 to qualify a communication system according to an embodiment of the present disclosure. Referring to FIG. 3, the eye mask 30 may include a rhombus shape having an upper voltage limit Vhigh, a lower voltage limit Vlow in the vertical direction (voltage domain), and an upper time limit Thigh and a lower time limit Tlow in the horizontal direction (time domain). The voltage height (voltage difference or distance between Vhigh and Vlow) determines the maximum voltage (eye height) of the eye opening, and the time width (time difference or distance between Thigh and Tlow) determines the maximum time boundary or edge (eye width) of the eye opening. In other words, when a noise waveform injected to a received signal has a voltage height and a jitter waveform has a phase jitter greater than the respective maximum voltage and maximum time boundary of the eye opening, the eye opening will likely be closed and bit errors will likely occur. Conversely, if the noise and jitter waveforms injected to the received signal is within the eye mask, no error will occur.

Figure 4:
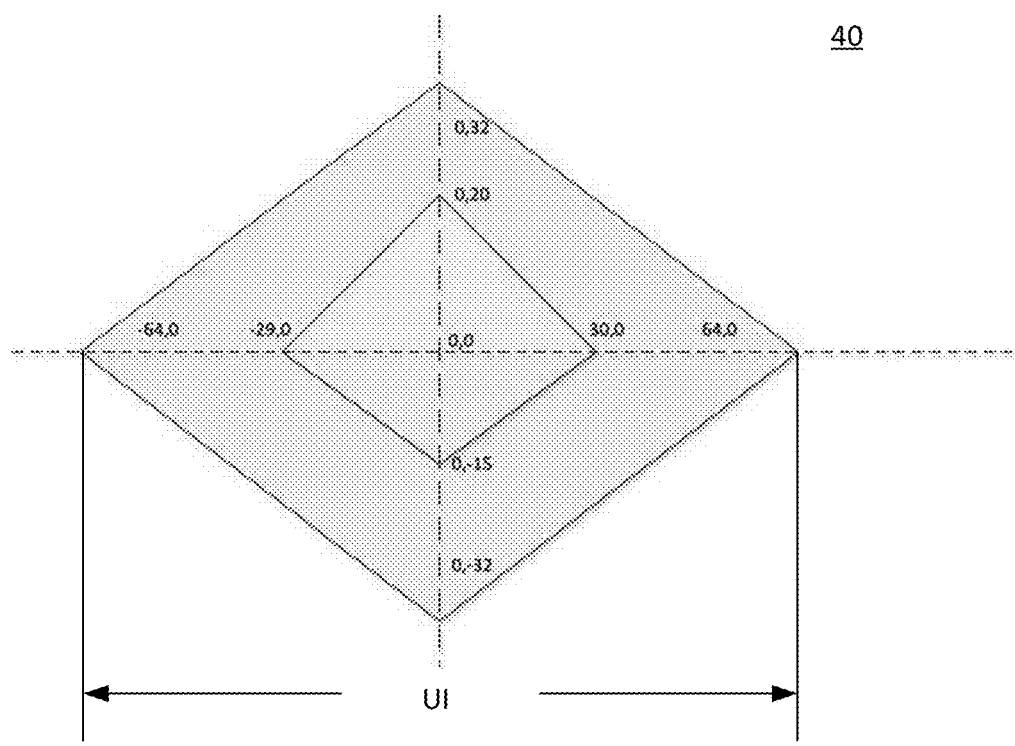
FIG. 4 shows an eye mask for describing an exemplary eye mask of a device under test according to an embodiment of the present disclosure.

FIG. 4 is an eye mask 40 for describing an exemplary eye mask of a device under test according to an embodiment of the present disclosure. In an exemplary embodiment, the device under test may be the receiver 105 of FIG. 1. Referring to FIG. 4, for an ideal unit interval (UI), the horizon time boundary of the eye mask 40 can be equally divided into a number of timeslots, e.g., 128 time slots. The vertical voltage of the eye mask can be divided into a number of equal amplitude portions, e.g., 64 amplitude portions (64 discrete voltage levels). As used herein, the term "unit interval" or "UI" refers to a time boundary of an eye mask. An eye mask of more than one UI has redundant samples and provides no additional information about the eye mask. As used herein, the time slots are also referred to as time steps, the amplitude portions are also referred to as amplitude steps, and the center of UI is referred to as {0,0} in both the horizontal (time) and vertical (amplitude) directions. For example, the center of the UI can be defined as the midpoint between the upper voltage limit Vhigh and the lower voltage limit Vlow in the vertical direction, and the midpoint between the upper time limit Thigh and the lower time limit Tlow in the horizontal direction. It is understood that the number of amplitude levels and the number of time slots can be any integer number. In the example shown in FIG. 4, 64 time slots are used in the right side of the UI (positive region) and 64 time slots are used in the left side of the UI (negative region), 32 voltage levels are used in the upper portion of the eye mask and 32 voltage levels are used in the lower portion of the eye mask. But it is understood that the numbers are arbitrary chosen for describing the example embodiment and should not be limiting.

In one embodiment, a hardware module (including, e.g., a state machine and logic circuitry) may test the vertical eye opening (eye height) first, thereafter the hardware (HW) module tests the horizontal opening (eye width). To test the vertical opening, the hardware module may calculate the vertical step starting from an initial step (i.e., 4), or {0,4}. Then the HW module will program the device under test (e.g., a PCIe PHY receiver or a SerDes device) with the initial value {0,4}. After running a test period, the HW module will read the error count. If the error count is 0, i.e., there is no error; the HW module will increase the vertical amplitude value with an offset value (e.g., 1), so that the next test point is {0, 5}. After running this new test period, the HW module will read the error count again.

In one embodiment, the HW module will continuously and iteratively execute the above steps, until the test point {0, 20} is reached. At this test point, after running the test period, the HW module will read out an error count value that is equal to or greater than 1. That means in this case, an error occurs at the device under test (the receiver) at this point. Thus, an eye opening result for the vertical positive amplitude is {0, 20}.

The HW module now may calculate the vertical negative opening. For example, the HW module may start at a test point {0, −4}, decrements the test point iteratively with a decrement offset value of −1 to obtain new test points {0, −5}, {0, −6}, . . . , and so forth until the test point {0, −15}, where the error count is read as 1 or greater. That means in this case, one or more errors have occurred at the device under test (the receiver) at this point. Thus, an eye opening result for the vertical negative amplitude is {0, −15}.

Next, the HW module will then calculate the horizon positive time value and horizontal negative time value to obtain a time boundary of the eye mask 40. For example, the HW module may start an initial time value of +6 or test point {0, +6}. After running a predetermined test period, the HW module will read the error count. If the error count is zero, i.e., no error has occurred, the HW module will increment the initial time value to an increment value and runs the next test period. The HW module will iteratively add increment values until an error count occurs, the HW module then saves the final increment value that causes the error count. The HW module then continue to measure or calculate the final negative time value that causes an error count. For example, the HW module may get a test point {30,0} for the positive time value, and {−29,0} for the negative time value.

As result, for this device under test (the receiver), the eye opening result is {20, −15, 30, −29}. In other words, the eye opening is not centered at {0, 0, 0, 0} for the device under test in this case.

For applications having multiple receivers, e.g., for a PCIe communication link having multiple lanes, the HW module can apply program test points to multiple lanes in parallel, starts the eye mask calculation process for each lane and obtain final test points of the eye mask for each lane consecutively by reading out the corresponding error count. As result, the HW module can obtain the eye masks of the multiple lanes consecutively. For example, the HW module may first start determining the voltage height (i.e., the vertical voltage boundary), then the time boundary of the eye mask of each receiver. Alternatively, the HW module may also start with the calculation or measurement of the horizontal time boundary (eye mask width) for each receiver, followed by the calculation and measurement of the voltage boundary. Of course, one of ordinary skill in the art would recognize many other alternatives, variations, and modifications.

Hardware State Machine

Embodiments of the present disclosure provide an autonomously operating hardware mechanism to calculate or measure an eye opening to determine an eye mask. In some embodiments, a firmware program may configure a hardware state machine, which will initialize the eye opening test, after a specific test time period, a HW module will assert test done signal (e.g., once an error count value is obtained). Then the firmware program can read out eye opening results from status registers.

To provide flexibility for determining an eye mask, the initial step for horizontal, vertical, the incremental units for each test point, and test time, error threshold are all programmable according to embodiments of the present disclosure. By providing programmability to the initial steps of the test points, test time periods, error count threshold, a controller can run firmware to set the speed and accuracy of an eye mask calculation or measurement.

According to one embodiment of the present disclosure, an autonomous eye opening hardware calculation method is provided. In the embodiment, firmware only requires to configure the device under test by setting a predetermined test period, initial voltage steps, initial time steps, positive and negative voltage limits, positive and negative time boundaries relative to the eye mask center, a number of incremental units per test cycle, and an error count threshold. Then firmware being a control program executed by a controller will program a start_test bit of a hardware (HW) module. The hardware module will assert a test done flag indicator to indicate that the eye opening test is completed. After the test done flag indicator is asserted, the firmware can then read out eye opening test results. In this mechanism, the device under test can perform the test autonomously from test start to test end, while the firmware can perform other useful operations during the autonomous test duration, instead of being involved in the eye opening test as required by conventional techniques.

According to one embodiment of the present disclosure, a state machine to handle this autonomous eye opening calculation is provided. The state machine can be implemented in a hardware electronic logic circuit, analog circuitry, or both.

Figure 5:
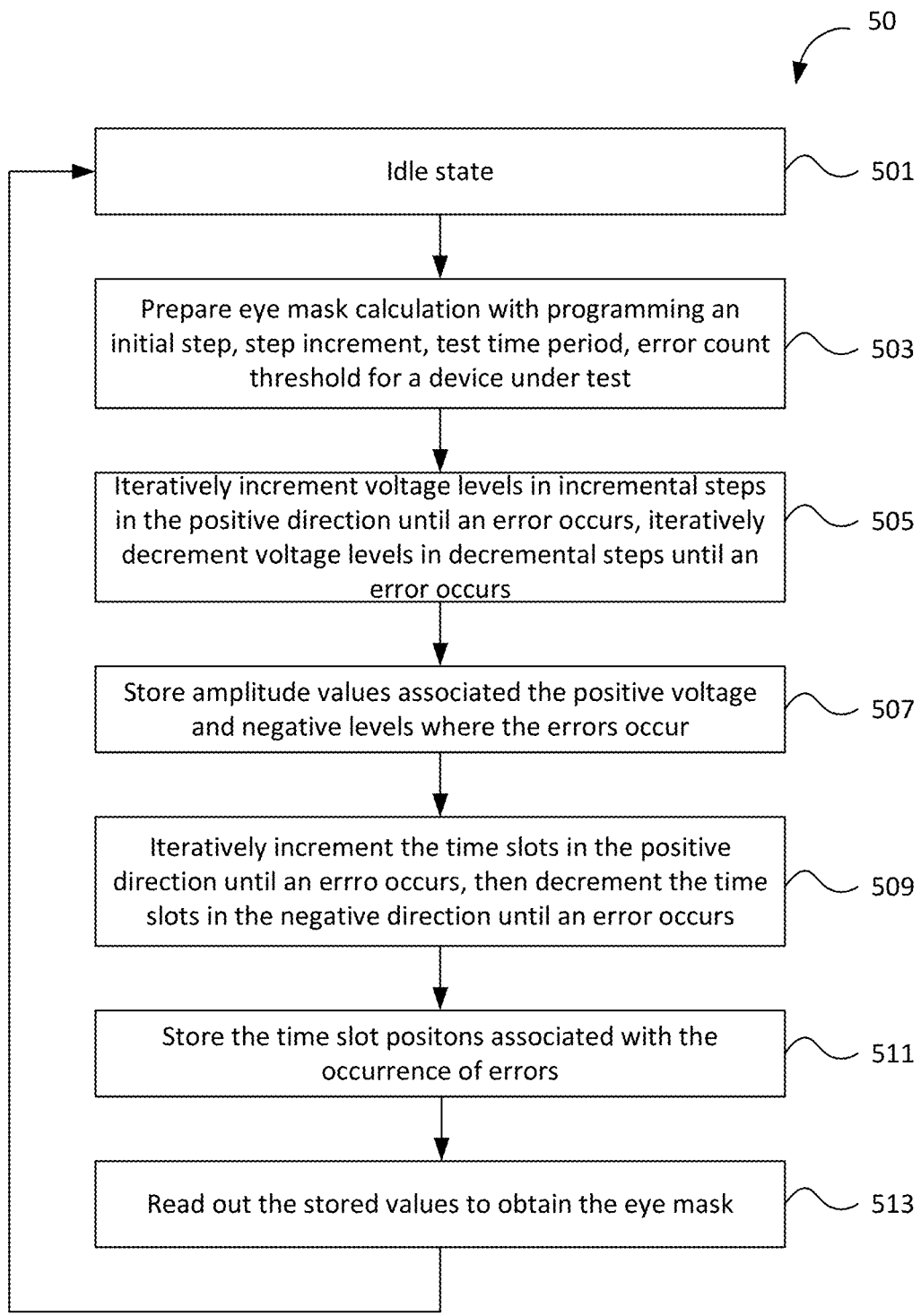
FIG. 5 is a state diagram for determining an eye mask of a device under test according to an embodiment of the present disclosure.

FIG. 5 is a state diagram 50 for determining an eye mask of a device under test according to an embodiment of the present disclosure. Referring to FIG. 5, an exemplary state machine may have a plurality of states. A hardware module including digital logic, control and data registers and memory may be in an idle state 501, where a device under test may be in a normal operation state or "idle" state. That is, the hardware module is not yet active or operative. When an input or a bit of the control register (e.g., start_test bit) of the HW module is asserted, the HW module transitions the state machine to an "init" state 503 and starts the eye mask calculation program by programming (setting) a predetermined initial step (e.g., for an initial amplitude level or an initial time slot), step increment, step decrement, test time period, time slot size, error count threshold, etc.) for the device under test. The state machine further includes a "voltage programming" state 505 where the voltage amplitude levels are iteratively incremented with the predetermined step increment until an error occurs or an error count threshold is exceeded, or when a predetermined test time period elapses. The hardware module then changes the voltage amplitude levels to the negative levels and runs the tests iteratively until an error occurs, or an error value exceeds the error count threshold, or when a predetermined test time period elapse. The hardware module stores both the positive and negative voltage levels in respective data registers in state 507. The state machine then transitions to a "time programming" state 509 that starts the eye mask calculation or measurement in the time domain by initializing a time starting point {0, t1} where t1 is an initial time slot value. The hardware module then runs the calculation or measurement until an error occurs, an error value exceeds the error count threshold, or a predetermined time period elapses. In the case that an error occurs or an error value exceeds the error count threshold, the hardware module stops the test and stores the corresponding time slot value into a data register. In the case that the predetermined time period elapses without the occurrence of an error, the hardware iteratively increments the time slot value by the predetermined time step value and continues the test until an error occurs. The time slot value that causes the error occurrence is then stored in a respective register. Similarly, the hardware module initialize a negative time slot point {0, −t2} where −t2 is an initial negative time slot value to start the eye mask calculation or measurement in the negative time direction to obtain the negative time slot value. In state 511, the positive and negative time slot values are stored in respective data registers. The stored amplitude values and time slop values are read out and displayed as an eye mask in a display device in a "finish" state 513. Once the stored amplitude values and time slot values are read out, the state machine may go back to the idle state 501 and waits for an INIT signal of the firmware to go to the "init" state 503. It is noted that the states or steps shown in FIG. 5 can occur in different orders and/or merged together. For example, state 505 and state 507 can be merged together, and state 509 and state 511 can be merged together. The merged states 505 and 507 can also be run after the merged states 509 and 511. In some embodiments, the states and steps can be performed in parallel or concurrently. It is further noted that the various states may be omitted or other states may be added in embodiments of the present disclosure as described further in detail below.

In one embodiment, the "idle" state 501 is where the device under test (DUT) operates under normal conditions, the "init" state 503 is to prepare an eye opening test, the voltage programming state 505 is to adjust voltage noises and calculate the BER error count. In one embodiment, the amplitude of voltage noises is continuously increased and/or decreased, until an error occurs or an error value exceeds or equal to the error count threshold so that the voltage eye opening number (the vertical test point position) is calculated. In another embodiment, the amplitude of voltage noises is incrementally and/or decrementally changed in steps, until an error occurs or an error value exceeds or equal to the error count threshold so that voltage eye opening number (the vertical test point position) is calculated.

The timing programming state 509 operates similarly to the voltage programming state. Instead of continuously or incrementally changing the amplitude level, the jitter amplitude is continuously or incrementally adjusted in the positive or negative position in relation to the center point until an error occurs or an error value exceeds the error count threshold, thereby obtaining a time boundary of the eye mask.

Once the time boundary (width) and the amplitude boundary (i.e., the height) of the eye mask are obtained, the eye mask calculation or measurement is complete, the values are then stored in associated register and/or read out. The state machine can return back to the idle state 501 so that the DUT operates in normal conditions. In some embodiments, the hardware module may operate the state machine for calculation the eye mask during the normal operation of the receiver (i.e., device under test).

Figure 6A:
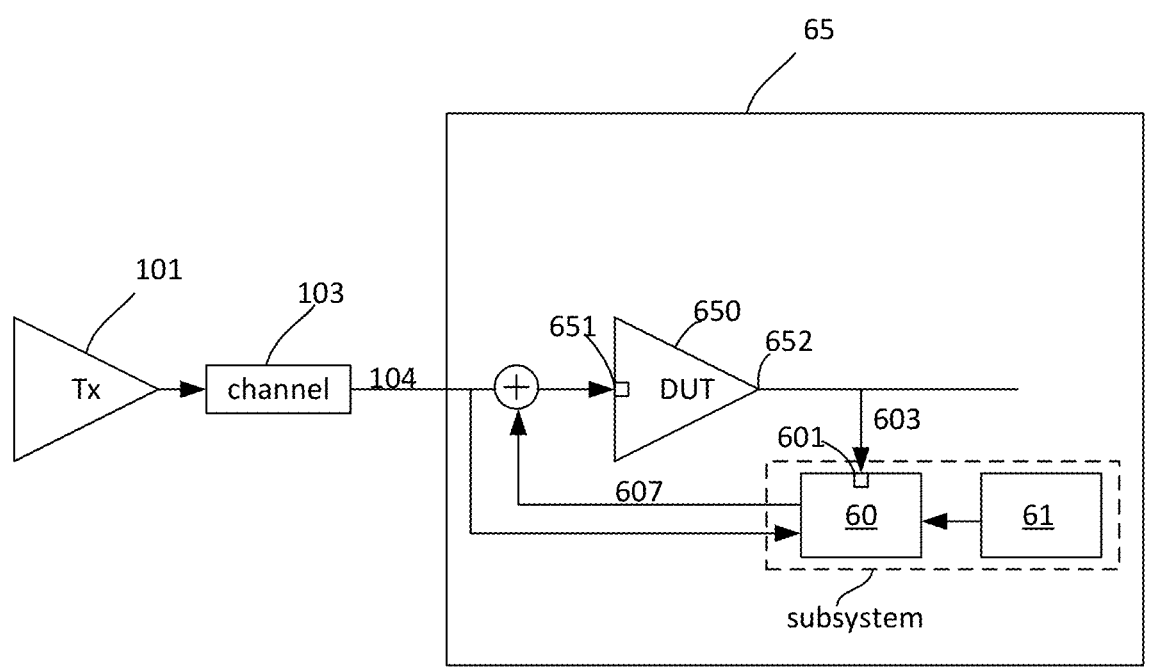
FIG. 6A is a simplified block diagram of a communication system according to an embodiment of the present disclosure.

FIG. 6A is a simplified block diagram of a communication system 6 that includes a transmitter 101, a channel 103, and a receiver 65 according to an embodiment of the present disclosure. The receiver 65 includes a device under test DUT 650 having an input 651 for receiving an input signal 104 and an output 652 for outputting an output signal 603, an eye mask calculation or measurement apparatus 60 having an input unit 601 coupled to the output of the DUT 650 for receiving the output signal 603, and a controller 61 including a state machine that may perform the operation steps described in FIG. 5 according to an embodiment of the present disclosure. The DUT 650 is configured to process the input signal (data bit stream) 104 to recover the input data stream and provide a corresponding output data stream. That is, the DUT 650 may include a clock and data recovery unit (e.g., a phase locked loop) and output the signal 603 having a logic high or logic low when the sampled signal is above or below a threshold value. The eye mask calculation or measurement apparatus 60 and the controller 61 may form an autonomously operating subsystem of the receiver 65. In one embodiment, the eye mask calculation or measurement apparatus 60 may iteratively apply voltage noise and time jitter increments to the DUT 650 according to steps shown in FIG. 5. The eye mask calculation or measurement apparatus 60 may determine an error occurrence by comparing the signal 603 with the signal 104. The subsystem may operate sporadically in response to an event, e.g., an event caused by a user or by polling a peripheral device to determine whether an event has occurred. The event will generate a trigger signal to start the state machine. The subsystem may include counter circuitry for counting a number clock cycles, test time period, and a bank of registers for storing an error count, voltage increment/decrement step sizes, strobe signal step resolution, voltage levels that cause an error occurrence, etc. Exemplary embodiments of the subsystem are described in more detail in the following FIGS. 6B and 6C.

Figure 6B:
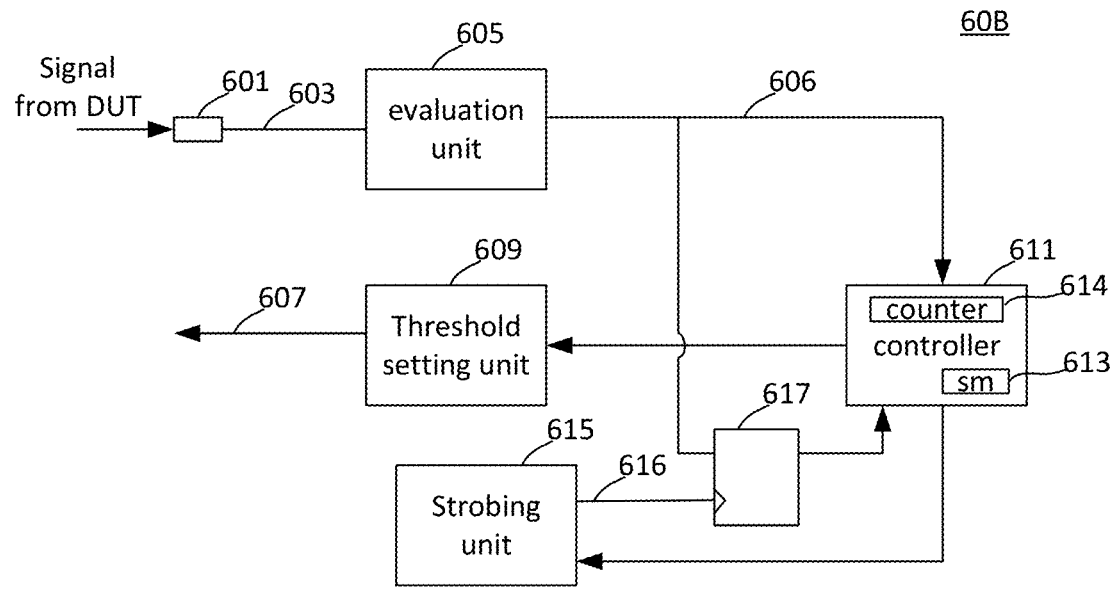
FIG. 6B is a block circuit diagram of a subsystem of FIG. 6A for determining an eye mask of a device under test according to an embodiment of the present disclosure.

FIG. 6B is a block circuit diagram of an apparatus or device 60B for determining an eye mask of a device under test (a receiver) according to an embodiment of the present disclosure. Referring to FIG. 6B, the apparatus 60B may include an input 601 for receiving an input data stream signal 603 provided by a device under test (DUT), a receiver evaluation unit 605 for evaluating a level of the input signal with a threshold value 607 provided by a threshold setting unit 609, a controller 611 that may include a state machine 613 for providing the states described in FIG. 5. The apparatus 60B may further include a strobing unit 615 configured to output a plurality of strobe signals 616 and a determining unit 617 configured to determine voltage boundary and a time boundary (width) of the eye mask using the plurality of strobe signals. The receiver evaluation unit is configured to provide an evaluation result 606 which indicates whether the level of the input signal is greater than or equal to a threshold value to determine an upper amplitude (time) level and a lower amplitude (time) level of the eye mask. In one exemplary embodiment, the receiver evaluation unit 605 is configured to sample the data stream output signal 603 provided by the DUT at a recovered clock provided by a clock recovery unit (a phase locked loop) integrated in the DUT. In one embodiment, the receiver evaluation unit 605 is further configured to compare the signal 603 with the signal 104 to determine or evaluate an error condition (i.e., that an error may be detected when the output signal 603 and the signal 104 do not match). The threshold setting unit 609 is configured to provide a set of voltage levels to the receive evaluation unit under the control of the controller 611. The controller 611 may also include a counter circuit or counter logic 614 configured to count a number of clock cycles until an error is detected or until a predetermined time period is elapsed or reached. For example, the number of clock cycles correspond to the number of bits received from the data stream signal 603.

Figure 6C:
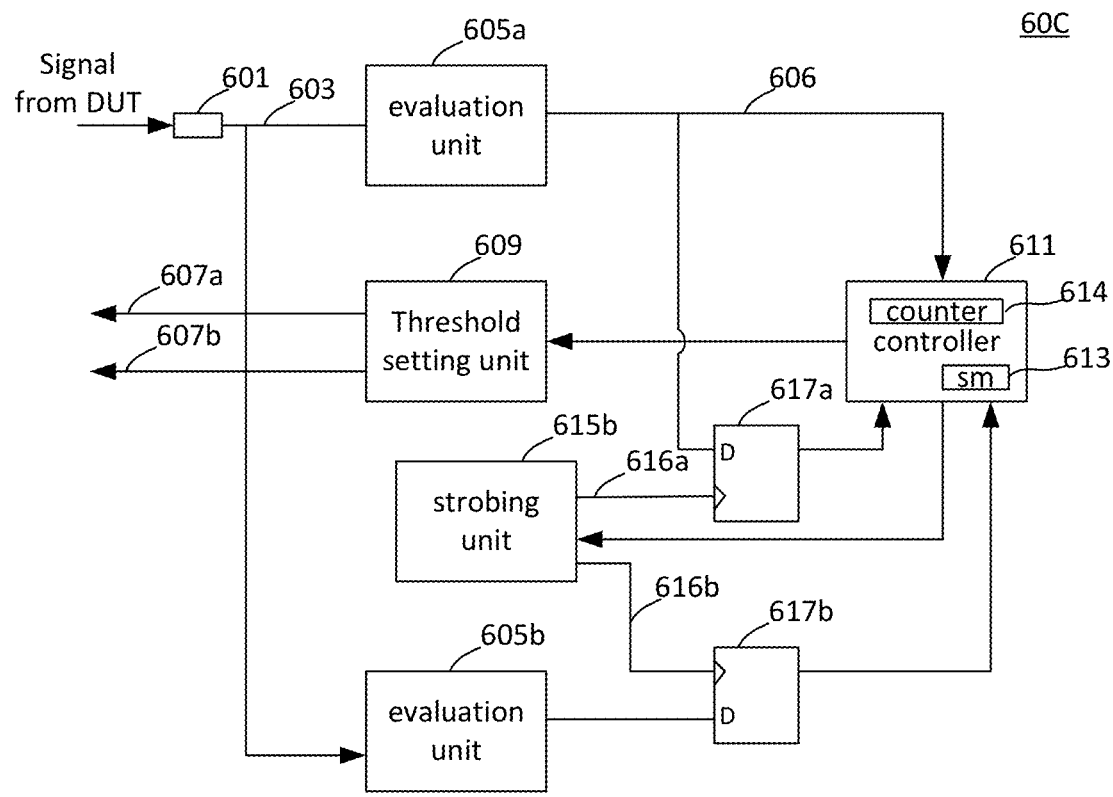
FIG. 6C is a block circuit diagram of a subsystem of FIG. 6A for determining an eye mask of a device under test according to an embodiment of the present disclosure.

FIG. 6C is a block circuit diagram of an apparatus or device 60C for determining an eye mask of a device under test (a receiver) according to another embodiment of the present disclosure. Referring to FIG. 6C, the apparatus 60C may include input 601 for receiving an input data stream signal 603 provided by the DUT, a first evaluation unit 605a configured to evaluate the level of the data stream signal 603 associated with a first threshold value 607a and a second evaluation unit 605b configured to evaluate the level of the data stream signal 603 associated with a second threshold value 607b. The first threshold value 607a may be a value of a set of values distributed between a first initial value and a maximum positive value in the voltage domain, and the second threshold value 607b may be a value of a set of values distributed between a second initial value and a time slot value in the time domain. In one embodiment, the first threshold value 607a is a (positive or negative) voltage signal level in the voltage domain, and the second threshold value 607a is a (positive or negative) time slot position in the time domain. The apparatus 60B may further include a threshold setting unit 609 configured to provide the first and second threshold values 607a, 607b respectfully under the control of a controller 611. The first and second threshold values 607a, 607b each when causing an error occurrence will provide the respective boundary values (height, width) of the eye mask. The apparatus 60C may also include a first determining unit 617a and a second determining unit 617b, and a strobing unit 615b configured to output a plurality of strobe signals 616a, 616b to the first and second determining units 617a, 617b for determining a level boundary (height) and time boundary (width) of an eye mask. Similarly, the controller also includes two counter circuits or counter logic as described above in connection with FIG. 6B. The counter units each count the number of errors until an error is detected or predetermined error threshold is reached. By having two evaluation units and two determining units and two counter circuits for determining the boundary voltage and time values, the entire eye mask can be obtained in half of the time as the configuration shown in FIG. 6B.

Figure 7:
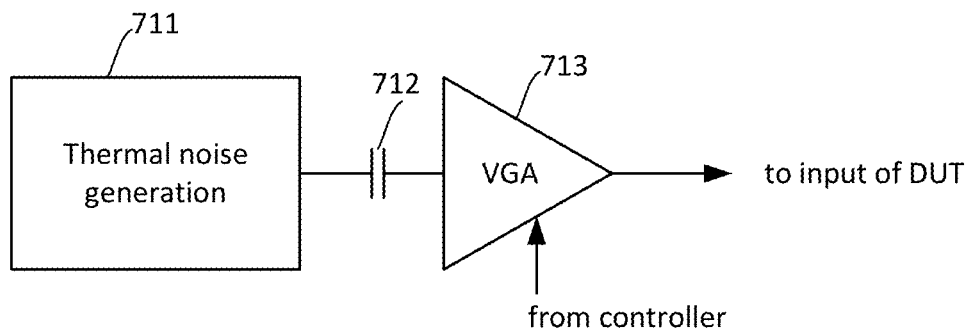
FIG. 7 is a simplified block circuit diagram of a threshold setting unit according to an embodiment of the present disclosure.

FIG. 7 is a simplified block circuit diagram of a threshold setting unit 70 according to an embodiment of the present disclosure. Referring to FIG. 7, the threshold setting unit 70 may include a thermal noise generation unit 711, a capacitive element 712, and a variable gain amplifier 713. In one embodiment, the thermal noise generation unit 711 may be a resistor that generates noise voltage whose square mean value is provided according to the relation 4 kRTB, where R is the resistance value, k is the Boltzmann's constant, T is the absolute temperature, and B is the frequency bandwidth. In one embodiment, the thermal noise generation unit 711 may be a semiconductor diode or a Zener diode. The noise voltage level generated by the thermal noise generation unit is coupled to the variable gain amplifier 713 through the capacitive element 712. The variable gain amplifier may generate discrete voltage levels or analog voltage levels based on control signals provided by a controller such as the controller 61 shown in FIG. 6A or 611 shown in FIGS. 6B and 6C. For example, the variable gain amplifier may include a plurality of amplifier units connected with each other in parallel. Each of the amplifier units can be turned on or turned off according to gain control signals provided by a controller. In one exemplary embodiment, the number of discrete voltage levels may be 64 corresponding to the number of voltage steps (voltage height) and 128 corresponding to the number of time slots of the eye mask 40 shown in FIG. 4. The thus generated voltage levels are added to the input signal 104 to reduce the input signal level (i.e., reduce the signal to noise ratio) or to increase the timing jitter in the input signal 104. The thermal noise generation unit 711 can be easily integrated in the subsystem 60 in FIG. 6A. Of course, one of ordinary skill in the art would recognize many variations, modifications, and alternatives. For example, the threshold setting unit 609 may be a R-2R constant-current switch ladder that is digitally controlled by the controller to provide the required number of voltage levels that are then added to the input signal 104. As used herein, the term "unit," "module," "logic," "circuit," "circuitry" may include hardwired circuitry, programmable circuitry (e.g., processor), software circuitry, firmware that stores instructions executed by programmable circuitry.

Figure 8A:
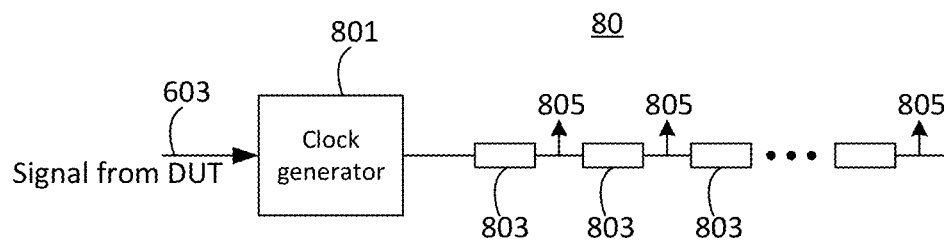
FIG. 8A is a simplified block circuit diagram of a strobing unit according to an embodiment of the present disclosure.
Figure 8B:
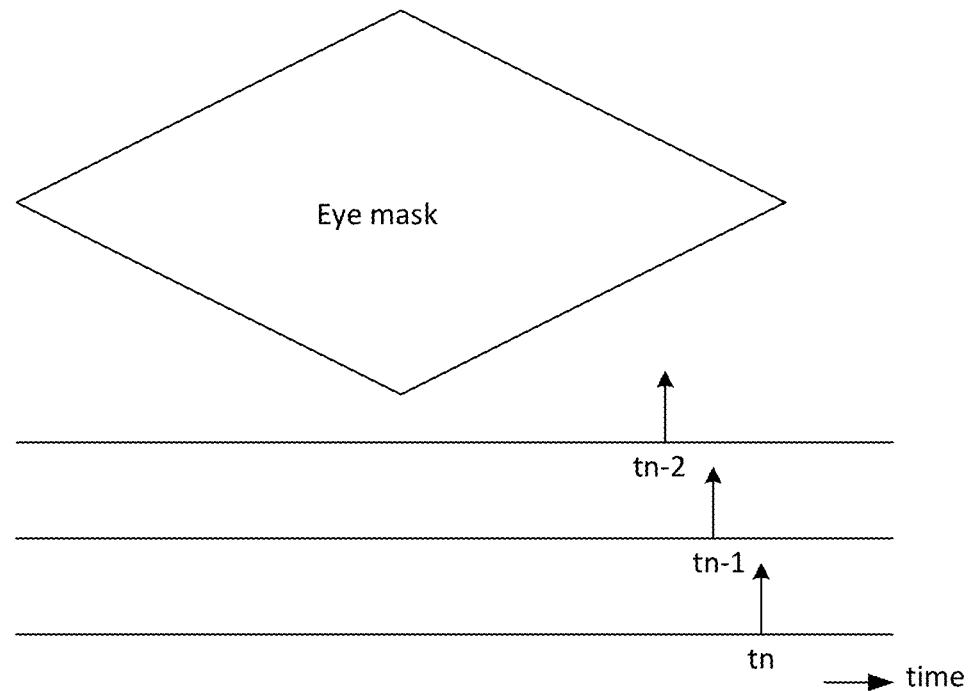
FIG. 8B shows a sequential strobing according to an embodiment of the present disclosure.
Figure 8C:
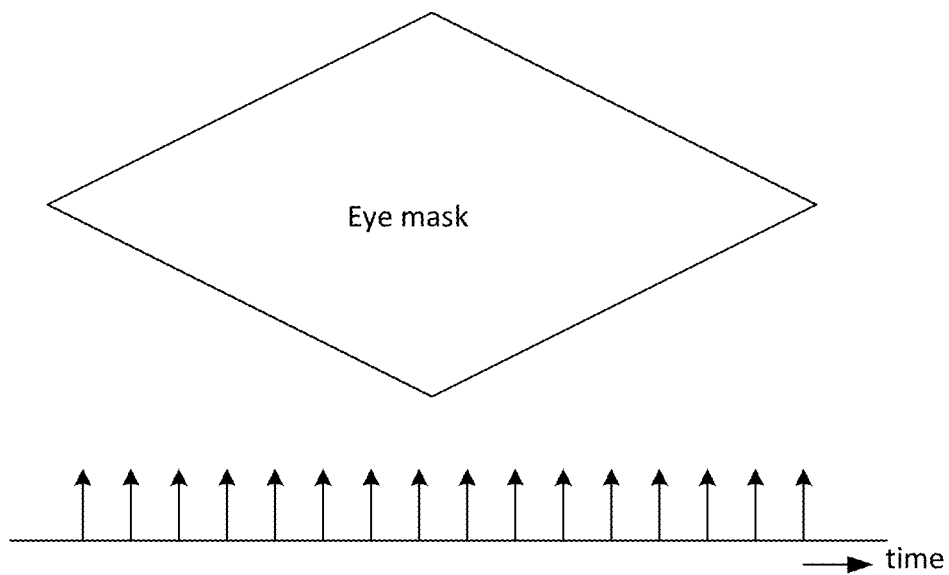
FIG. 8C shows a parallel strobing of an entire eye mask according to an embodiment of the present disclosure.
Figure 8D:
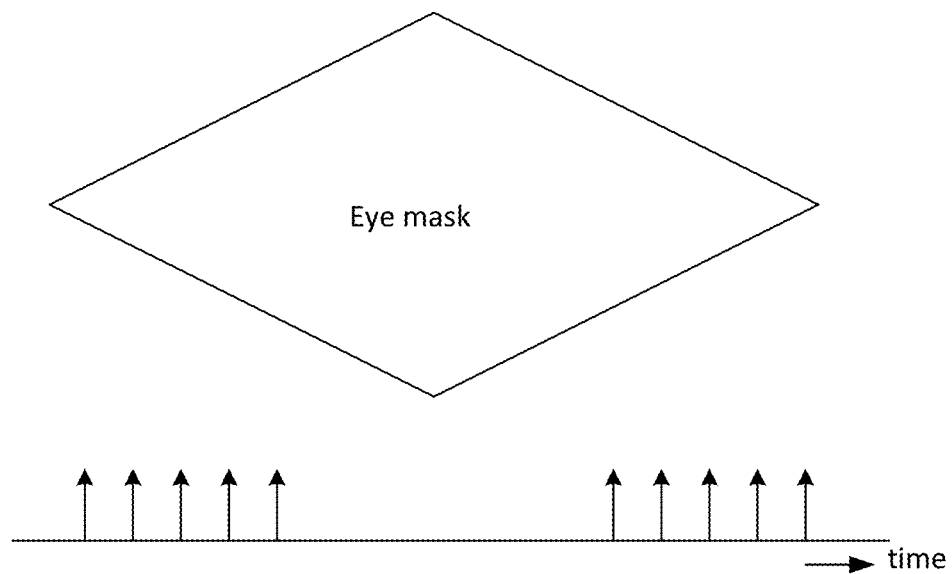
FIG. 8D shows a partially parallel strobing at the edges of an eye mask according to an embodiment of the present disclosure.

FIG. 8A is a simplified block circuit diagram of a strobing unit 80 according to an embodiment of the present disclosure. Referring to FIG. 8A, the strobing unit 80 may include a clock generator 801 and a set of delay elements 803 each having a same delay time for generating a plurality of strobe signals 805. In one embodiment, the clock generator may be a phase-locked loop that generates a clock signal from the received signal 603 provided by the DUT. In another embodiment, the clock generator is the phase-locked loop integrated with the DUT. In one embodiment, the plurality of strobe signals may be provided sequentially to the determining unit 617 as shown in FIG. 8B. In another embodiment, the determining unit 617 may include a plurality of time slot measurement units switched in parallel each being concurrently coupled to one of the plurality of strobe signals to determine a time boundary of the eye mask as shown in FIG. 8C. In yet another embodiment, the determining unit 617 may include a plurality of time slot measurement units switched in parallel each being concurrently coupled to one of the plurality of strobe signals present in the vicinity of the edges of the eye mask to determine a time boundary of the eye mask as shown in FIG. 8D. Although FIGS. 8A through 8D show the different time boundary (eye width) measurements for the eye mask, the same concept may also apply to the eye height measurements as well.

Figure 9A:
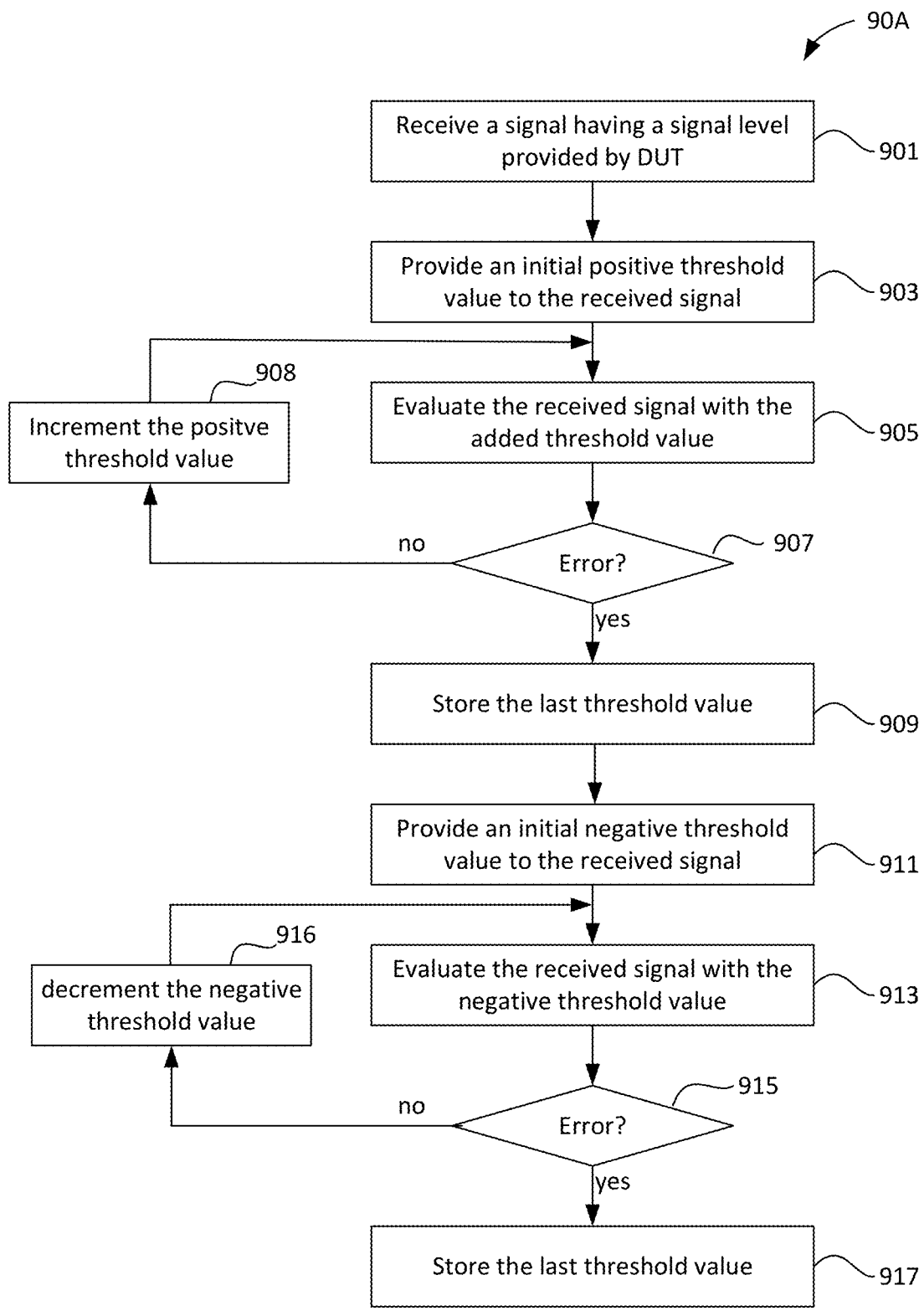
FIG. 9A is a simplified flowchart of a method for determining an eye mask of a device under test according to an embodiment of the present disclosure.

FIG. 9A is a simplified flowchart of a method 90A for determining an eye mask of a device under test (e.g., a receiver) according to an embodiment of the present disclosure. Referring to FIG. 9A, the method 90A may include receiving a signal (e.g., data bit stream) having a signal level provided by the device under test (DUT) at 901, providing an initial positive voltage threshold value to the received signal to obtain a signal level (903), and evaluating the signal level (i.e., the received signal with the added threshold value) to obtain an evaluation result (905). If an error is detected or a predetermined error count has been reached (yes in 907), that means the signal level is outside the eye mask, the method includes storing the voltage threshold value (which is the last voltage threshold value provided to the evaluation unit) at 909. If there is no error (no at 907), that means the signal level is within the eye mask, the method includes increasing the threshold value by an increment at 908 and evaluating the new incremented threshold value. The method includes iteratively running steps 905, 907 and 908 until an error is detected or a predetermined error count is reached, the method then includes storing the last threshold value associated with the error occurrence at 909. The method then processes to step 911 to provide an initial negative threshold value to the comparison unit and iteratively runs steps 913 (evaluating the signal level with a decremented negative voltage threshold value), 915 (detecting an error occurrence or a predetermined error count has been reached), and 916 (decrementing the voltage threshold value) until an error is detected or the predetermined error count has been reached at 915, i.e., the signal level is outside the eye mask. The process then includes storing the last decremented voltage threshold value. It should be noted that the sequence of steps may be performed in different orders. For example, the method 90A may perform the steps 911 through 917 before steps 903 to 909.

Figure 9B:
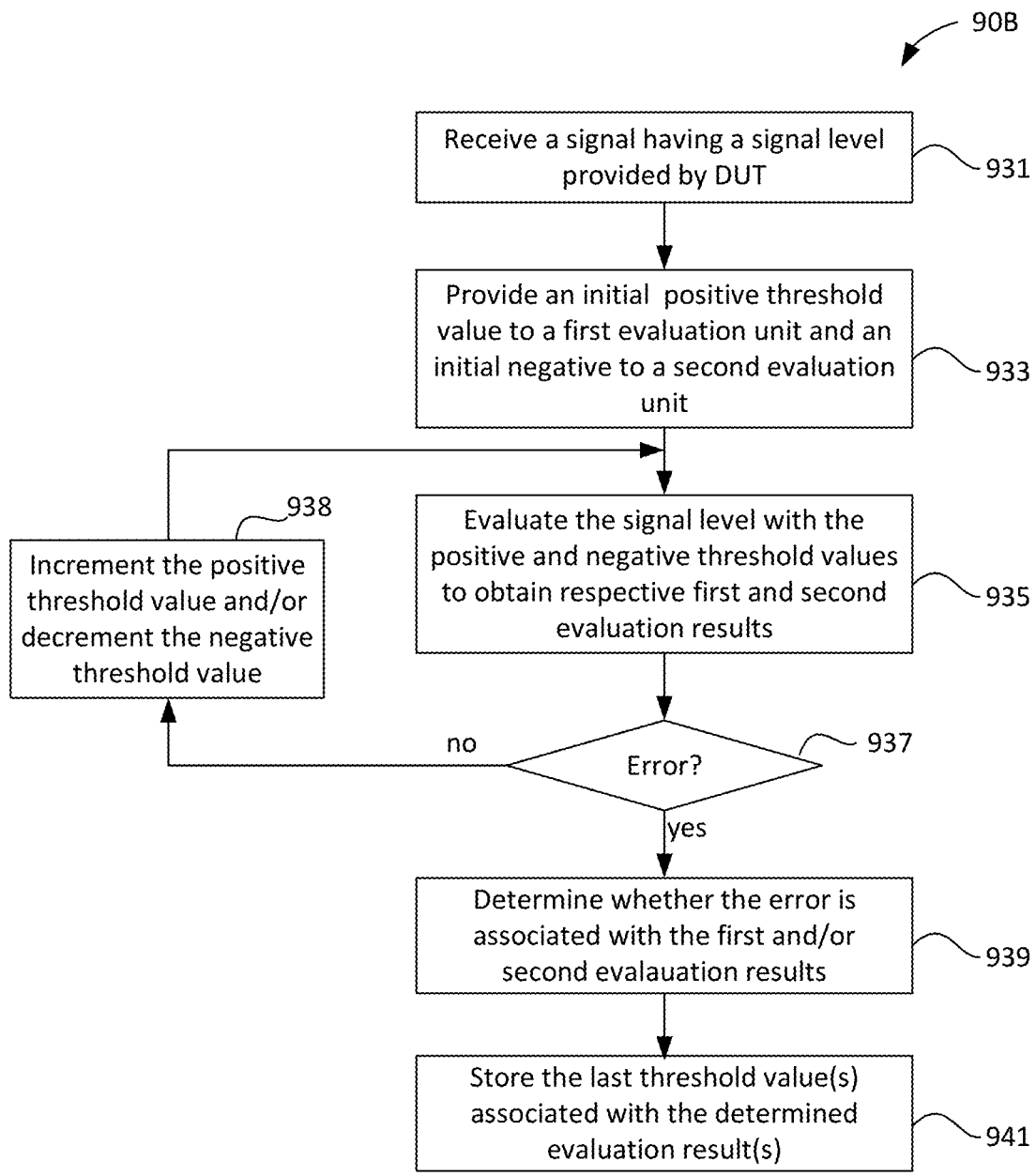
FIG. 9B is a simplified flowchart of a method for determining an eye mask of a device under test according to another embodiment of the present disclosure.

FIG. 9B is a simplified flowchart of a method 90B for determining an eye mask of a device under test (e.g., a receiver) according to an embodiment of the present disclosure. Referring to FIG. 9B, the method 90B may include receiving a signal having a signal level provided by the device under test (DUT) at 931, providing a positive initial voltage threshold value to a first evaluation unit and a negative initial voltage threshold value to a second evaluation unit at 933, evaluating the signal level with the positive voltage threshold level by the first evaluation unit to obtain a first evaluation result and evaluating the signal level with the negative voltage threshold level by the second evaluation unit to obtain a second evaluation result at 935. The method 90B further includes determining whether an error condition (an error is detected or a predetermined error count has been reached) occurs at 937, if there is no error occurrence (no at 937), the method proceeds to step 938 to increase the positive threshold by an increment and decrease the negative voltage threshold value by a decrement and evaluate the signal level with both the incremented and decremented threshold values at 935 until an error condition occurs (e.g., an error or accumulated error count exceeds a predetermined error threshold value). If an error condition occurs (yes at 937), the method 90B includes determining whether the error condition is associated with the first evaluation result, the second evaluation result, or both at 939. The method then includes storing the last threshold value(s) associated with the first evaluation result and/or the second evaluation result if the error is associated with both comparison results (941), i.e., the center of the eye mask is at a midpoint between the Vhigh and Vlow as shown in FIG. 3.

Figure 9C:
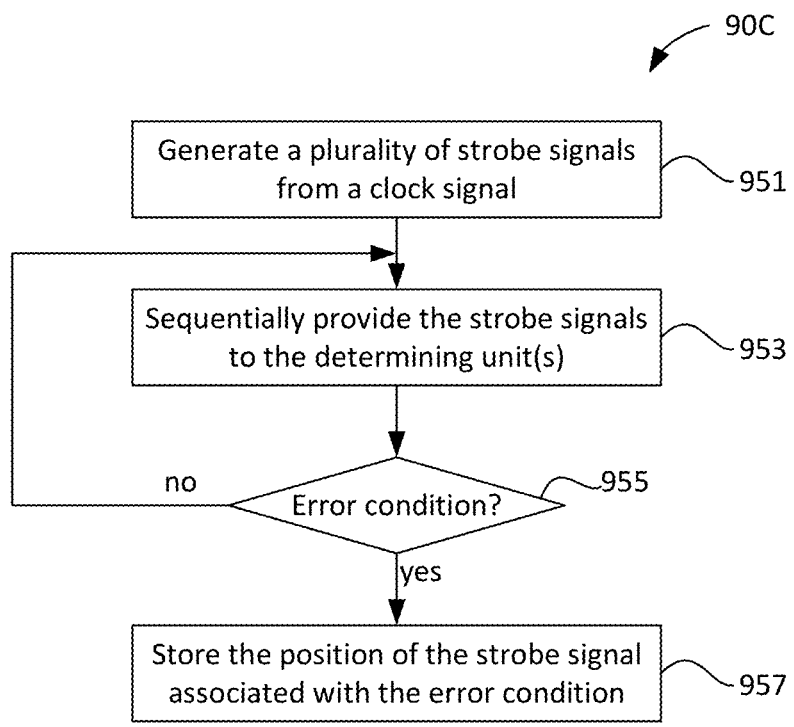
FIG. 9C is a simplified flowchart of a method for determining a time boundary of an eye mask of a device under test according to an embodiment of the present disclosure.

In some embodiments, the method 90A or 90B further includes determining a time boundary of the eye mask using the process shown in FIG. 8B, 8C, or 8D. FIG. 9C is a simplified flowchart of a method 90C for determining an eye mask of a device under test (DUT) according to an embodiment of the present disclosure. Referring to FIG. 9C, the method 90C may include generating a plurality of strobe signals from a clock signal at 951. The clock signal may be derived by a signal received from an output of the DUT. The method 90C may also include sequentially providing the strobe signals to the determining unit(s) to determine a time boundary of an eye mask at 953. The strobe signals may be sequentially provided to the determining unit(s) through electronic switches under the control of the controller. The method 90C may further include determining whether an error condition occurs at 955. If an error condition occurs (yes at 955), the method 90C includes storing the position of the strobe signal that is associated with the error, i.e., the time boundary of the eye mask at 957. If no error condition is determined (no at 955), the method includes going back to step 953 to provide the next strobe signal(s) to the determining unit(s). In some embodiment, the methods 90A, 90B, and 90C may include counting a number of clock cycles to determine a predetermined time period when the maximum, minimum voltage threshold values, and maximum, minimum time edges have been reached and no error has been detected. The methods 90A, 90B, and 90C may include terminating the operations when the predetermined time period has been reached. In this case, the eye mask is determined to have the maximum eye opening, i.e., the height is determined by Hhigh and Vlow, and the width is determined by Thigh and Tlow as shown in FIG. 3.

According to the present disclosure, an eye-opening calculation apparatus may include a state machine. The state machine may include the following states: an idle state, an init state, a voltage programming state, a timing programming state, and a completion state. In one embodiment, the state machine is implement on the receiver side to simulate the deterioration of received data signals and perform the eye mask calculation. The state machine may be implemented using logic gates, an application specific integrated circuit (ASIC), a microcontroller, a processing unit, or a software module.

In one embodiment, the idle state allows the device under test (a receiver) to operate under normal conditions, the init state allows the test apparatus to set up measurement parameters such as initial voltage threshold values, initial time slot values, test time period. The voltage programming state allows sequentially or concurrently measuring and calculating the positive and the negative threshold values of the eye mask. The time programming state allows sequentially or concurrently measuring and calculating the time boundary of the eye mask. In another embodiment, the voltage programming state and the time programming state may be performed concurrently to obtain the height (in the voltage domain) and the width (in the time domain) of the eye mask.

Figure 10:
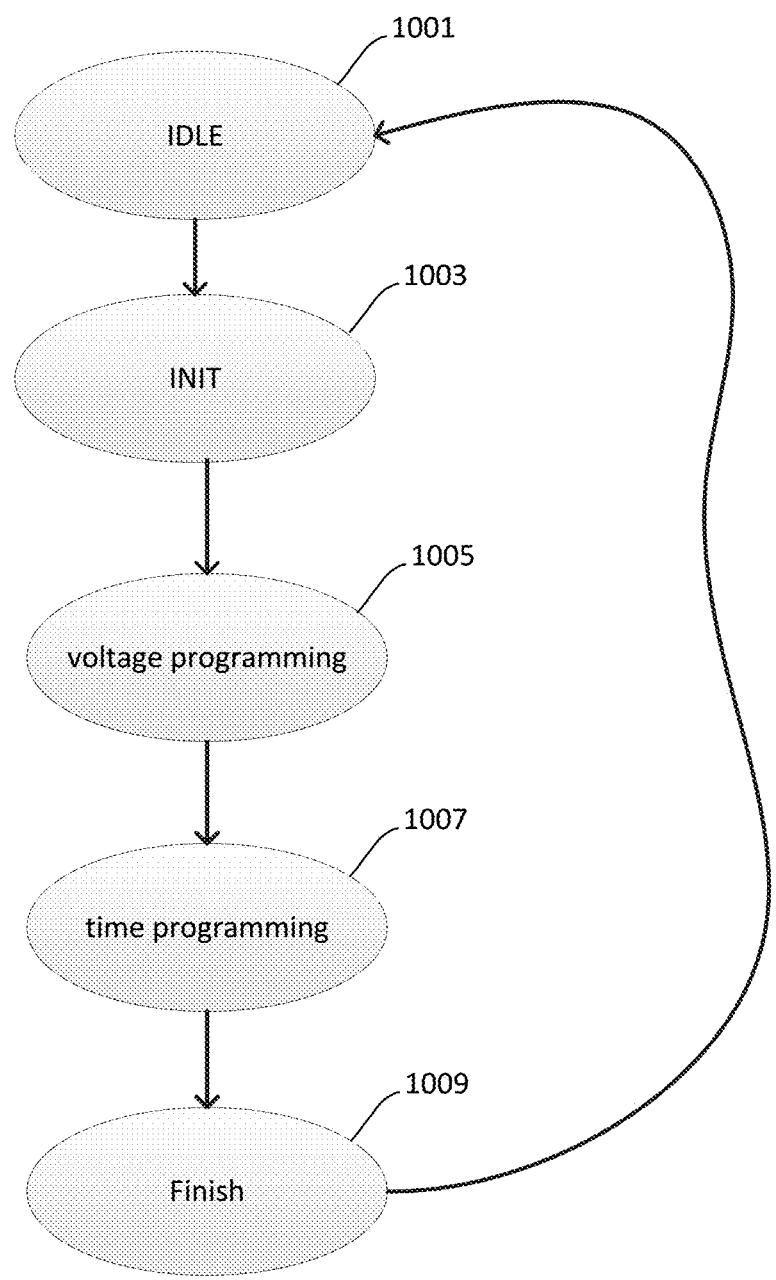
FIG. 10 is a state machine describing the operations of a subsystem that is embedded or integrated in a receiver according to an embodiment of the present disclosure.

FIG. 10 is a state machine describing the operations of a subsystem that is embedded or integrated in a receiver according to an embodiment of the present disclosure. The subsystem may be the subsystem shown in FIG. 6A. The subsystem is generally in the idle state 1001 where it is not operating to conserve power. In the idle state, the receiver (i.e., the device under test DUT 650) is in the normal operation mode and the subsystem is waiting for an event or polling a peripheral device to determine if an event has occurred. If an event is determined or identified, the subsystem enters to the init state 1003. The firmware (e.g., the eye mask calculation or measurement apparatus 60 and the operation state machine of the controller 61 of FIG. 6A) prepares the eye mask test program initial step, the increment/decrement voltage steps and strobe resolution, the error count threshold, the test duration period. In the case where the receiver includes multiple devices under test (DUTs), each of the eye mask calculation or measurement apparatuses associated with one of the DUTs is appropriately programmed or set up. Once the eye mask test program initial step is set or programmed, the operation state machine transitions to a voltage programming state 1005 that sets positive voltage increment and negative voltage decrement from the initial voltage step. For each test point, the eye mask calculation or measurement apparatus 60 determines whether an error condition (an error is detected or a predetermined error count is reached) has occurred. The eye mask calculation or measurement apparatus continues until whether an error condition has occurred or the increment or decrement has reached the maximum number of steps or the test time period has been reached. In the case where an error condition has occurred, the firmware causes the eye mask calculation or measurement apparatus 60 to determine the positions of the increment step and decrement step at this test point, i.e., the values of the positive and negative voltages, store the positions (values of the positive and negative voltages) to corresponding registers in a register bank. In the case where the receiver has multiple DUTs, the values of the positive and negative voltage levels of each DUT that cause the error occurrence will be saved in corresponding registers.

Thereafter, the operation state machine transitions to a time programming state 1007 that sets a positive time increment and negative time decrement from the initial time step. For each test point, the eye mask calculation or measurement apparatus 60 determines whether an error condition has occurred. The eye mask calculation or measurement apparatus continues until whether an error condition has occurred or the increment or decrement has reached the maximum number of steps or the test time period has been reached. In the case where an error condition has occurred, the firmware causes the eye mask calculation or measurement apparatus 60 to determine the positions of the increment time step and/or decrement time step at this test point, i.e., the values of the positive and negative time slots, store the positions (values) of the minimum time point and the maximum test point on the time axis (corresponding to the width of the eye mask) to corresponding registers. In the case where the receiver has multiple DUTs, the values of the positive and negative time points of each DUT that cause the error occurrence will be saved in corresponding registers.

After the eye mask for each of the DUTs has been determined, the operation state machine transitions to a finish state 1009 and complete the eye mask calculation or measurement. The operation state machine sets the receiver back into the normal operation mode and the eye mask test and measurement subsystem back to the idle state 1001 where it is awaiting a next event and has the lowest level of power consumption. When the eye mask test or measurement is complete, the values stored in the bank of registers can be read out and/or displayed.

In operation, the operation state machine transitions from state to state upon completion of a state. In one embodiment, an operation state machine is associated with an eye mask calculation or measurement apparatus that is coupled to a receiver. The operation state machine together with the eye mask calculation or measurement apparatus operates autonomously once the parameters are set. There is no further involvement from the firmware. In one embodiment, an operation state machine and the eye mask calculation or measurement apparatus can be sequentially shared by a number of receivers. In some embodiments, the operation state machine functions may be provided by a controller that includes a microprocessor, clock and memory (ROM, SRAM, flash).

As used herein, the terms "operation state machine" and "state machine" are used interchangeably. The terms "eye mask", "eye opening," and "eye opening pattern" are used interchangeably. The terms "eye mask calculation," "eye mask measurement," "eye opening determination" are used interchangeably.

Figure 11:
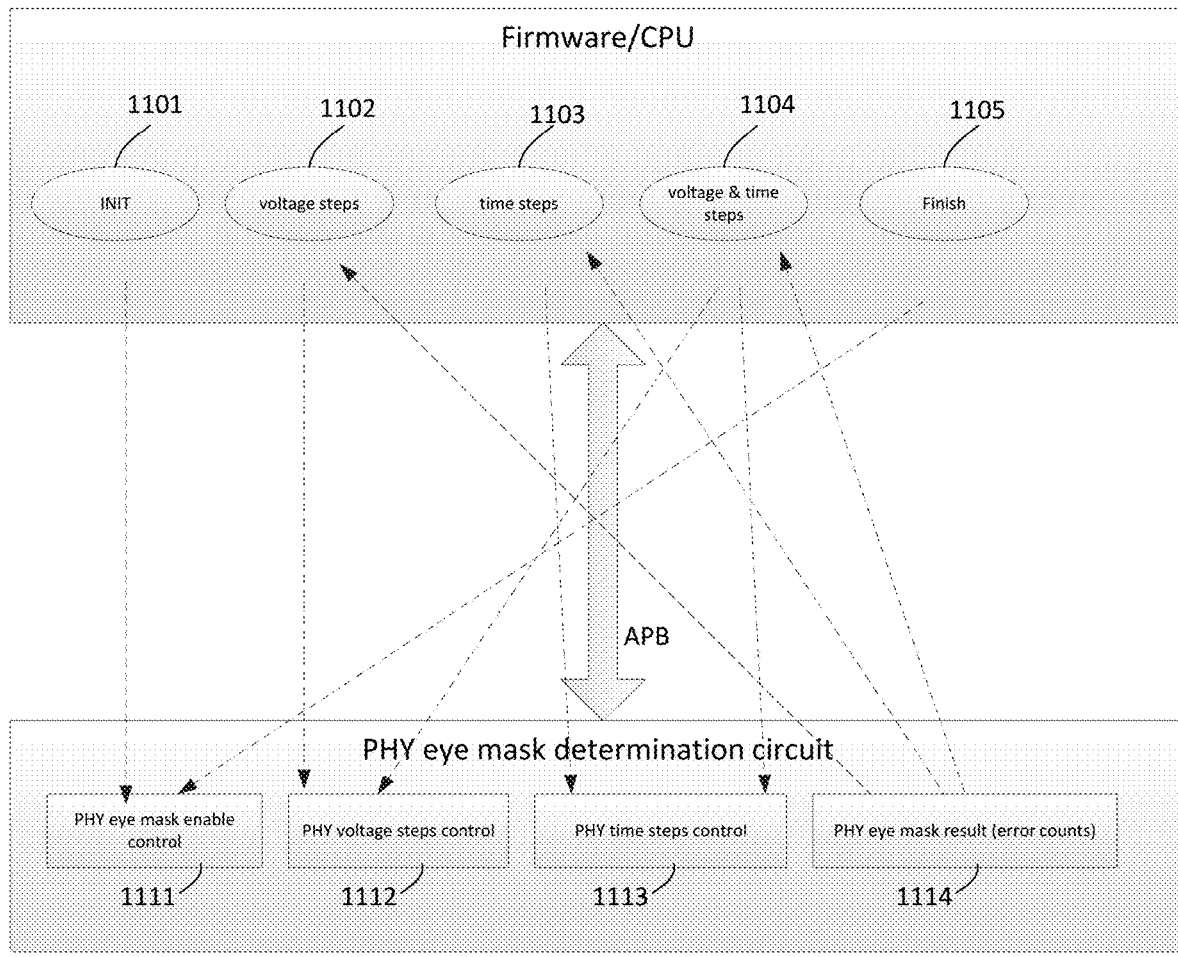
FIG. 11 is a high-level block diagram of an exemplary autonomous subsystem which interacts with the operation state machine according to an embodiment of the present disclosure.

FIG. 11 is a high-level block diagram of an exemplary autonomous subsystem which interacts with the operation state machine according to an embodiment of the present disclosure. Referring to FIG. 11, a firmware or a CPU generates the state machine functions required to operate the eye mask calculation (eye mask measurement, eye opening determination). The state machine includes several states responsible for controlling the operations of hardware components used to set up voltage increment/decrement step sizes, resolution of strobe signals, error count threshold, test or measurement time period or duration (e.g., number of clock cycles), evaluation results storage and display, etc. In the example embodiment, the state machine may include an init state 1101 that initializes the physical eye mask calculation circuit and programs necessary registers through a peripheral bus, e.g., the advanced peripheral bus (APB). The state machine may also include a voltage steps setting state 1102 that changes or sets voltage steps, programs the voltage registers, changes the voltage steps directions, sets a test time period duration before reading results of the eye mask determination. The state machine may also include a time strobing steps setting state 1103 that sets time strobing steps or resolution, programs the time strobe registers, sets a test time period duration before reading results of the eye mask determination. The state machine may also include a voltage and time steps setting state 1104 that changes or sets both the voltage and time steps, programs the voltage and time registers, sets a test time period duration before reading results of the eye mask determination. The state machine may also include a finish state 1105 that disable the eye mask determination (calculation or measurement) circuit.

Referring still to FIG. 11, a physical eye mask determination circuit (eye mask calculation or measurement apparatus or device) that is in communication with the firmware or CPU through a low bandwidth bus (e.g., APB). The physical eye mask determination circuit includes multiple hardware components: a physical eye mask enable control component 1111 that is in communication with the init state 1101 and the finish state 1105 and configured to enable or disable the eye mask determination circuit, a physical voltage steps control component 1112 that is in communication with the voltage steps state 1102 and voltage and time steps state 1104, a physical time steps control component 1113 that is in communication with the time steps state 1103 and the voltages and time steps state 1104, and a physical eye mask result (error counts) component 1114 that delivers an error count result to the voltage steps state 1102, the time steps state 1103, and the voltages and time steps state 1104. When the state machine is in the voltages and time steps state 1104, the eye mask determination circuit operates the voltage steps control component and the time steps control component concurrently, and the determination results of both the voltage values (for calculation of the eye mask height) and time values (for calculation of the eye mask width) are stored in a register bank.

Figure 12:
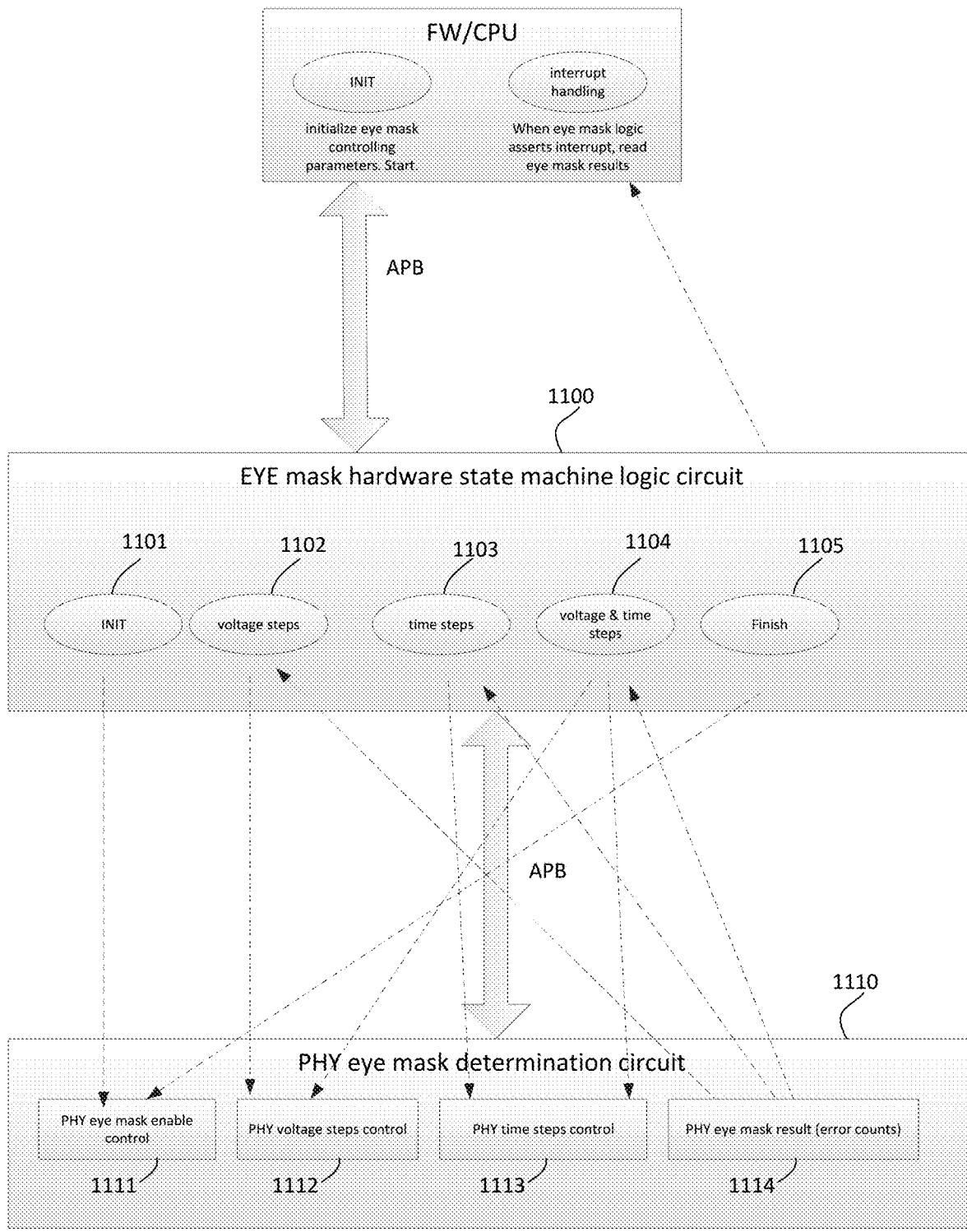
FIG. 12 is a high-level block diagram of an exemplary autonomous subsystem which interacts with the operation state machine according to an embodiment of the present disclosure.

FIG. 12 is a high-level block diagram of an exemplary autonomous subsystem which interacts with the operation state machine according to another embodiment of the present disclosure. The exemplary embodiment shown in FIG. 12 is similar to the embodiment shown in FIG. 11, so that only the different structures from those in the embodiment of FIG. 11 will be described. Referring to FIG. 12, instead that the firmware or the CPU generates the state machine states 1101 to 1105, theses state machine states 1101 to 1105 are generated by an eye mask hardware state machine logic circuit 1100 to off load the firmware or the CPU. In other words, instead of having a software programmable state machine using firmware or a CPU as shown in FIG. 11, the state machine in FIG. 12 is hardware configurable using hardware logic circuit (e.g., field programmable gate array or digital signal processing circuitry). The firmware or CPU is in communication with the eye mask hardware state machine logic circuit 1100 through a low bandwidth bus, such as an advanced peripheral bus (APB) or any other bus that has similar bus bandwidth characteristics and capable of communicating between the firmware or the CPU and the hardware state machine logic circuit. The eye mask hardware state machine logic 1100 is also in communication with a physical eye mask determination circuit 1110 using a low bandwidth bus that may be an advanced peripheral bus (APB) or any other bus that has similar bus bandwidth characteristics. In some embodiment, the eye mask hardware state machine logic circuit 1100 is in communication with the firmware or the CPU and the physical eye mask determination 1110 using the same low bandwidth bus, e.g., the same advanced peripheral bus (APB). Once the firmware or the CPU programs the hardware state machine logic circuit 1100, the firmware or the CPU is relieved to process other tasks thereby improving the performance of the receiver or system. The hardware state machine logic circuit 1100 together with the eye mask determination circuit 1110 will process autonomously to calculate or measure the eye mask and save the results in the bank of registers. Once the eye mask determination operations are completed and the results have been saved in the bank of registers, the hardware state machine logic circuit 1100 will assert a test done signal to the firmware or CPU to read out the results from the bank of registers.

Table 1 shows some registers of the bank of registers that may be programmed by the firmware or CPU to control the state machine according to an exemplary embodiment of the present disclosure.

TABLE 1

| Register name | function | Control/Status |
| --- | --- | --- |
| TIMEOUT[31:0] | This is the timeout value for each step of the eye mask scanning operation. When a malfunction of PHY eye mask scanning operation is detected for a state machine, TIMEOUT period will expire for a hang recovery of that state machine. | FW control |
| INIT_STEP[3:0] | Eye opening test is not necessary starting from eye center. It could start from an initial step set by this register. | FW control |
| STEP_INCREMENTAL[6:0] | After one step test is done, the next step is not necessary increased by 1. It could increase by 2 or more controlled by this register. | FW control |
| STEP_LIMIT[6:0] | This register is to program the maximal steps to be tested to avoid unnecessary calculation. Time or voltage test steps begin with INIT_STEP, and incremental by STEP_INCREMENTAL, and ending with error count or STEP_LIMIT. | FW control |
| ERRLIMIT[31:0] | This is the criteria to determine eye mask boundary. When an error count is larger than ERRLIMIT, this test point is outside of the eye mask. | FW control |

TABLE 1-continued

| Register name | function | Control/Status |
|---|---|---|
| TEST_STATUS[31:0] | Otherwise it is inside of the eye mask. Bit[7:0] is to indicate lane7 to lane0 north side test status. If the value is 1, it means this lane north side eye scanning test is complete. Bit[15:8] is to indicate lane7 to lane0 south side test status. Bit[23:16] is to indicate lane7 to lane0 east side test status. Bit[31:24] is to indicate lane7 to lane0 west side test status. | HW Status |
| INTERRUPT_STATUS[31:0] | Each interrupt status bit will be asserted 1 when corresponding TEST_STATUS bit is 1, and is cleared by FW/CPU. | HW status |
| INTERRUPT enable[31:0] | This is to enable a test_status bit transition from 0 to 1 will trigger interrupt. If the state machine will finish with TEST_STATUS[31], then interrupt enable[31] can be program to 1. So that the interrupt is asserted indicating the test is complete. | FW control |
| TEST_INTERRUPT | INTERRUPT to FW/CPU with TEST_STATUS, and INTERRUPT enable. | HW interrupt |
| Lane0 results[31:0] | Bit[7:0] is to indicate lane0 north side eye mask result. Bit[15:8] is to indicate lane0 south side eye mask result. Bit[23:16] is to indicate lane0 east side eye mask result. Bit[31:24] is to indicate lane0 west side eye mask result. | HW status |
| Lane1 results[31:0] | Lane1 results, similar as above | HW status |
| Lane2 results[31:0] | Lane2 results, similar as above | HW status |
| Lane3 results[31:0] | Lane3 results, similar as above | HW status |
| Lane4 results[31:0] | Lane4 results, similar as above | HW status |
| Lane5 results[31:0] | Lane5 results, similar as above | HW status |
| Lane6 results[31:0] | Lane6 results, similar as above | HW status |
| Lane7 results[31:0] | Lane7 results, similar as above | HW status |

Figure 13:
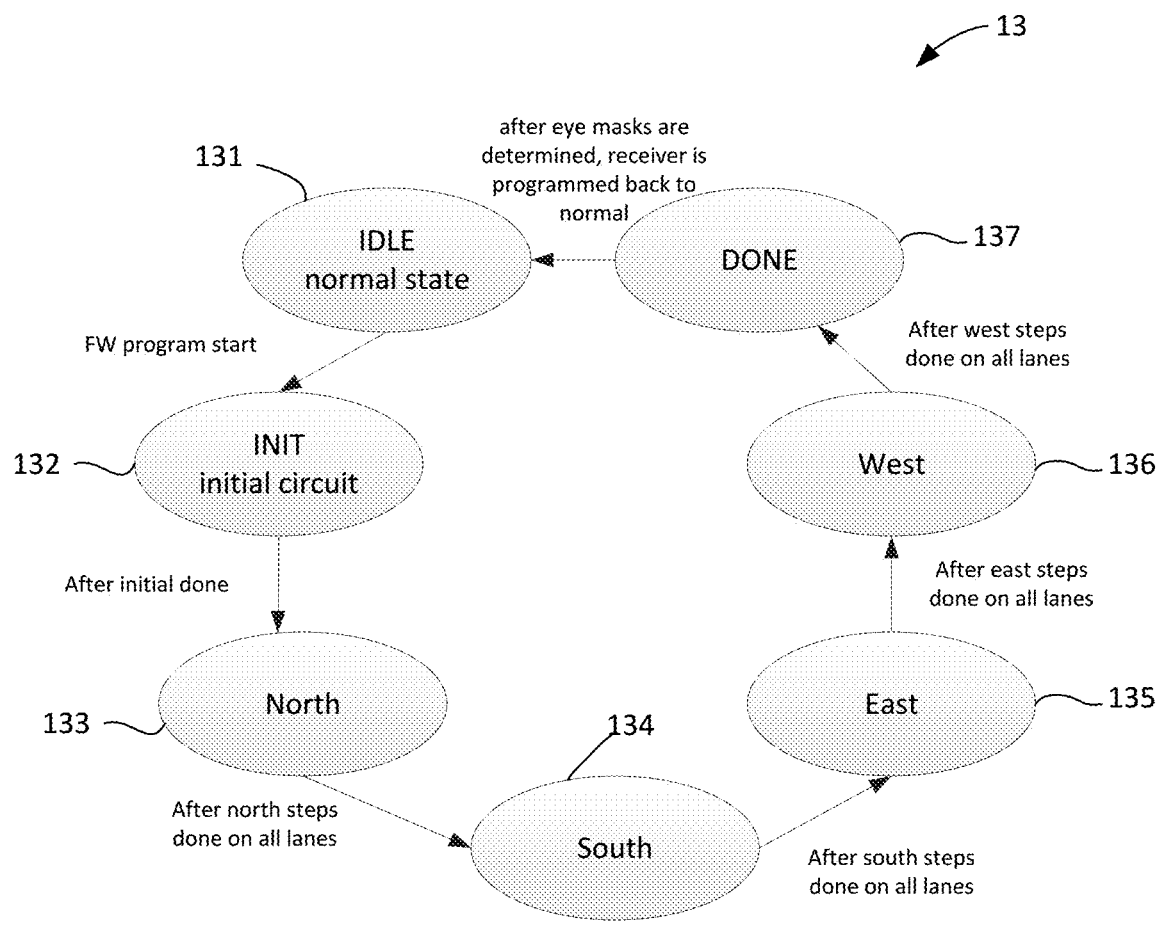
FIG. 13 shows an example of a state machine having different states for operating an eye mask calculation or measurement of an apparatus in a receiver under test according to an embodiment of the present disclosure.

FIG. 13 shows an example of a state machine 13 where the state machine is in an IDLE state 131 in a normal operation of a receiver under test according to an embodiment of the present disclosure. The state machine 13 can be a software state machine as described with reference to FIG. 11 or a hardware state machine as described with reference to FIG. 12. Referring to FIG. 13, a process of operating an eye mask calculation or measurement apparatus for a receiver commences with an IDLE state 131 where the receiver may include one or more devices under test. For example, the receiver may be a PCIe PHY receiver including one or more lanes. The process may be performed by a firmware, a CPU, hardware state machine or a software state machine that detects an initializing signal and proceeds to an INIT state 132 to initialize hardware components such as the eye mask enable control circuit 1111 of the eye mask determination circuit shown in FIGS. 11 and 12. Thereafter, t process proceeds to a NORTH state 133 that include a number of steps, functions, or operations that operates on the receiver. After the steps, functions, or operations of the North state have been performed, the process proceeds to the South state 134 that performs predetermined operations on the receiver under test. Thereafter, the process proceeds to the East state 135 that performs other predetermined functions and/or operations on the receiver under test. Thereafter, the process proceeds to the West state 136 that further performs functions and/or operations on the receiver under test. When the process completes the functions and/or operations in the West state 136, it proceeds to the DONE state 137 that may disable the eye mask calculation or measurement apparatus and places the receiver back to its normal operational mode (IDLE normal state 131). As used herein, the terms "North," "South," "East," and "West" may broadly refer to a processing domain including a plurality of processing steps, functions and/or operations. The different steps, functions, and/or operations are grouped in various states using directional notations (north, south, east, west), however, any other notation scheme for referring groupings may be employed without deviating from the scope of the present disclosure.

Table 2 shows operations of a state machine according to an exemplary embodiment of the present disclosure.

TABLE 2

| State name | function | action |
|---|---|---|
| IDLE | Normal operation mode | |
| INIT | Initialize the PHY eye mask circuit | Logic will program PHY eye mask related parameters from lane0 to lane7 |
| NORTH | Calculate north direction eye mask result for all the lanes | Logic will go to sub states |

TABLE 2-continued

| State name | function | action |
|---|---|---|
| SOUTH | Calculate south direction eye mask result for all the lanes | Logic will go to sub states |
| East | Calculate east direction eye mask result for all the lanes | Logic will go to sub states |
| West | Calculate west direction eye mask result for all the lanes | Logic will go to sub states |
| DONE | Programming eye mask registers back to normal | Logic will program PHY eye mask related parameters from lane0 to lane7 back to normal |

Figure 14:
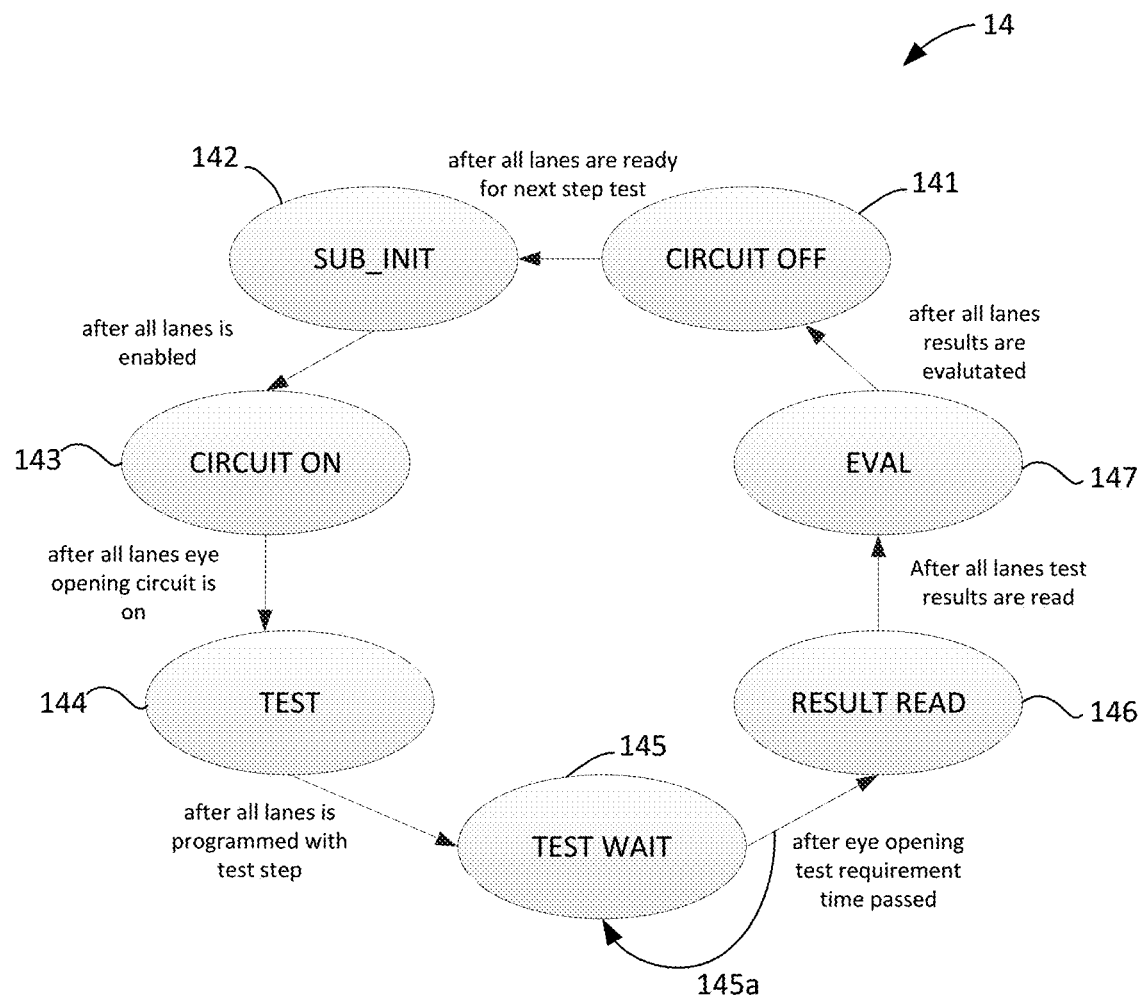
FIG. 14 is an exemplary state machine having different states for operating an eye mask calculation or measurement of an apparatus in a receiver under test according to an embodiment of the present disclosure.

FIG. 14 shows an example of a state machine 14 where the state machine is operative in a subsystem of a receiver under test according to an embodiment of the present disclosure. The subsystem may be the subsystem shown and described in FIGS. 6A, 6B, 6C, 11, and 12. The state machine 14 can be a software state machine as described with reference to FIG. 11 or a hardware state machine as described with reference to FIG. 12. The states shown in FIG. 14 may be associated with the states shown in FIG. 13 and Table 2. Referring to FIG. 14, the state machine 14 commences at the circuit-off state 141 where the subsystem for an eye mask calculation or measurement device is disabled or powered off. In the circuit-off state, the subsystem is in an idle state and polls a certain event triggered by an external device or a user. Upon detecting the occurrence of an event, the state machine transitions to a SUB-INIT state 142 that enables the receiver. In one exemplary embodiment, the receiver is a PCIe receiver having a plurality of lanes, all the lanes are enabled or turned on. The state machine then proceeds to a circuit-on state 143 that enables or turns on the subsystem associated with the receiver. The subsystem may include an eye mask determination circuit having hardware components as shown and described in connection with FIGS. 6A, 6B, 6C, 11, and 12. After enabling or turning on the eye mask determination circuit, the state machine proceeds to a test state 144 that may include setting or programming voltage and time steps increment/decrement, test time period, and other parameters associated with the eye mask calculation or measurement. The state machine then proceeds to enter a test wait state 145 that may include a timer to measure out a predetermined waiting period. When the predetermined waiting period has been reached or when an error condition is determined, the state machine enters a result reading state 146 that determines the maximum and minimal values of the voltages and time steps that cause the error occurrence. When the predetermined waiting period has been reached and there is no error occurrence, the subsystem may cause the hardware components to increment or decrement the voltage values and/or change the strobe signal positions, wait out the test waiting period and repeat these steps (indicated by arrow 145a) until an error condition occurs (error is detected or an error threshold has been reached). After the results of all lanes (devices under test of the receiver) are read and stored in a register bank, the state machine enters an EVAL state 147 that evaluates the results of the eye mask tests on all the lanes and may display the results (e.g., the eye mask of a select device under test or all eye masks of the devices under test) on an electronic display panel or print the results using a printer. Thereafter, when all devices under test in the receiver have been evaluated, the state machine enters a circuit-off state 141 that disables or turns off the an eye mask calculation or measurement device to conserve power.

In some embodiments, the states 141 through 147 are sub-states for each of the North, South, East, West states shown in FIG. 13. For each subs-state, the task is to program related PHY eye opening registers for all the lanes (lane0 to lane3, lane0 to lane7), wait a time period, or read PHY result registers.

Table 3 shows operations of a sub-states for each North, South, East and West states according to an exemplary embodiment of the present disclosure.

TABLE 3

| Sub states | function | action |
|---|---|---|
| SUB_INIT/STEP | To prepare the test steps/direction | Calculate test steps/directions |
| CIRCUIT ON | Prepare PHY circuit for the eye mask test | Program PHY eye mask circuit to enable |
| TEST STEP | Program test steps from lane0 to lane7 | Program lane0 to lane7 test step/direction value to related PHY register |
| TEST WAIT | Wait test time | Test cycle counting until reach the limit |
| RESULT READ | Read test results from lane0 to lane7 | Read and latch lane0 to lane7 result register |
| EVAL | Evaluate test result, proceed the next step or setting test results | compare the test results value with errlimit, set status, or increment next test step |
| CIRCUIT OFF | Turn off | Turn off circuit. |

Figure 15:
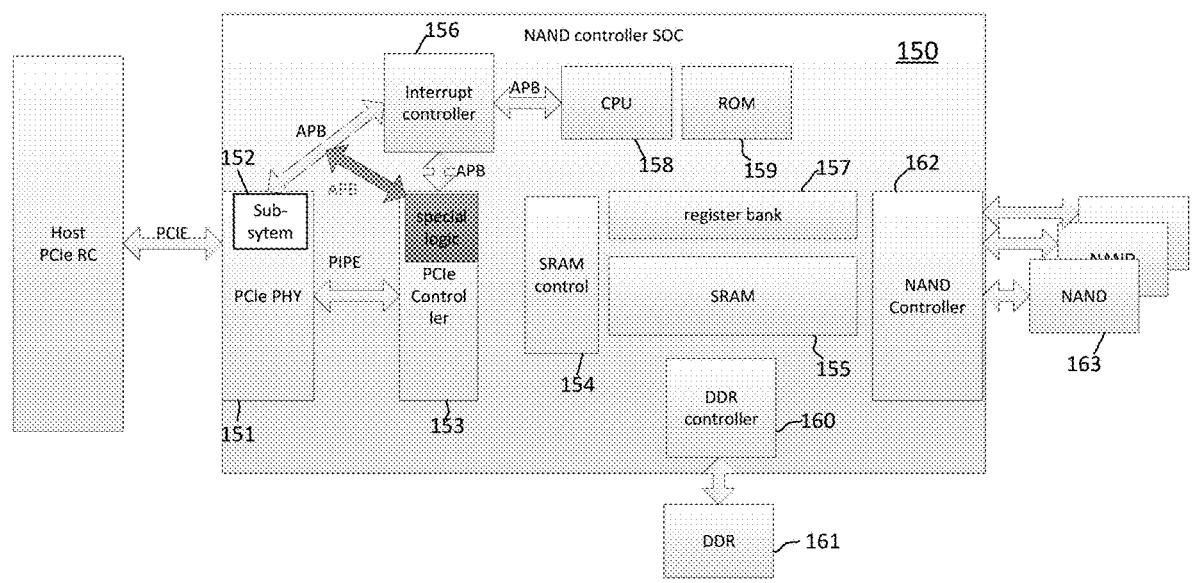
FIG. 15 is an integrated circuit illustrating a NAND controller system on-chip (SOC) in communication with a host having a PCI Express module with a root complex (PCIe RC) according to an embodiment of the present disclosure.

FIG. 15 is an integrated circuit illustrating a NAND controller system on-chip (SOC) 150 in communication with a host having a PCI Express module with a root complex (PCIe RC) according to an embodiment of the present disclosure. The integrated circuit (NAND controller SOC) 150 may include a PCIe physical layer (PHY) 151 containing a plurality of lanes in communication with the PCIe RC. The PCIe PHY layer 151 may include a subsystem 152 (e.g., an eye mask determination circuit shown in FIGS. 6A, 6B, 6C, 11, and 12). The integrated circuit may also include a PCIe controller 153 coupled to the PCIe PHY layer 151, a SRAM controller 154, a SRAM 155 coupled to the SRAM controller. The PCIe controller 153 may include firmware or a CPU that provides a state machine to control the subsystem 152 through an advanced peripheral bus APB. The integrated circuit may further include an interrupt controller 156 configured to receive an interrupt signal from a user or an external device and in communication with the subsystem 152 through a low speed bus, such as an advanced microcontroller bus architecture advanced peripheral (AMBA-APB) bus, a register bank 157 containing a plurality of registers configured to store evaluation results provided by the subsystem 152, a CPU 158 in communication with the interrupt controller through a low speed bus, such as an APB bus, and a read only memory (ROM) device 159. The integrated circuit may further include a double-data rate (DDR) controller 160 in communication with external DDR memory devices 161, and a NAND controller 162 in communication with external NAND flash memory devices. In some embodiments, the APB busses between the interrupt controller, the CPU, the subsystem, and the special logic in the PCIe controller are the same APB bus. In other embodiments, the APB busses between the interrupt controller, the CPU, the subsystem, and the special logic in the PCIe controller are different APB busses.

The embodiment of FIG. 15 represents one specific application platform for the eye mask evaluation subsystem where the integrated circuit 150 is a NAND controller having a PCIe layer. Although one CPU is presented, the embodiment of the present disclosure may have more than one CPU. In some embodiments, the firmware is implemented by the CPU. In other embodiments, the firmware may be implemented by a microcontroller, software, hardware logic, and combination thereof.

In one embodiment, the device under test is a PCIe PHY receiver. In one embodiment, the device under test is a SERDES receiver. In one embodiment, the subsystem may include a controller (e.g., a microcontroller), a memory device for storing instruction codes executable by the microcontroller, an input device for inputting measurement parameters to the device under test, an output device for outputting the stored values to a display device, one or more comparison units for comparing a signal level provided by a device under test with a series of threshold values for determining the height of the eye mask, and a strobing unit having a plurality of delayed strobe signals for determining the time boundary of the eye mask. The state machine is implemented by hardware, software, or a combination of hardware and software. The controller is integrated with the device under test on a same die.

The embodiments disclosed herein are not to be limited in scope by the specific embodiments described herein. Various modifications of the embodiments of the present disclosure, in addition to those described herein, will be apparent to those of ordinary skill in the art from the foregoing description and accompanying drawings. Further, although some of the embodiments of the present disclosure have been described in the context of a particular implementation in a particular environment for a particular purpose, those of ordinary skill in the art will recognize that its usefulness is not limited thereto and that the embodiments of the present disclosure can be beneficially implemented in any number of environments for any number of purposes.

What is claimed is:

1. An apparatus for determining an eye mask of a device under test (DUT) configured to receive a data bit stream including a threshold value, comprising:
   an input coupled to the DUT and configured to receive an output signal provided by the DUT;
   a level and time evaluation unit coupled to the input and configured to evaluate the received output signal and provide an evaluation result;
   a processor-implemented controller configured to change the threshold value in response to the evaluation result; and
   a level threshold setting unit configured to provide the threshold value that is adjustable between a predetermined low threshold value and a predetermined high threshold value in fixed voltage increments or decrements,
   wherein the apparatus is integrated into the DUT.

2. The apparatus of claim 1, wherein a vertical distance between the predetermined low threshold value and the predetermined high threshold value is a height of the eye mask, and a horizontal distance between the low threshold value and the high threshold value is a width of the eye mask.

3. The apparatus of claim 1, wherein the level threshold setting unit comprises an initial threshold value that is at a midpoint of the low threshold value and the high threshold value.

4. The apparatus of claim 1, further comprising:
   a strobe signal generating unit configured to determine a time boundary of the eye mask.

5. The apparatus of claim 4, wherein the strobe signal generating unit comprises a plurality of delay elements coupled to a clock signal and configured to provide a plurality of delay strobe signals.

6. The apparatus of claim 5, wherein the clock signal is synchronous with the received output signal.

7. The apparatus of claim 5, wherein the plurality of delay elements are connected in series, each of the plurality of delay elements having a same delay time.

8. An apparatus for determining an eye mask of a device under test (DUT) configured to receive a data bit stream signal and output an output stream signal, the apparatus comprising:
   an input coupled to the DUT and configured to receive the output stream signal provided by the DUT;
   a level threshold setting unit configured to provide a level threshold value to the data bit stream signal;
   a time threshold setting unit configured to provide a time threshold value to the data bit stream signal;
   a level evaluation unit configured to evaluate the output stream signal and output a first evaluation result;
   a time evaluation unit configured to evaluate the output stream signal and output a second evaluation result;
   a processor-implemented controller configured to adjust the level threshold value and the time threshold value in response to the first evaluation result and the second evaluation result.

9. The apparatus of claim 8, further comprising:
   a strobe signal generating unit configured to determine a time boundary and a level boundary of the eye mask.

10. The apparatus of claim 9, wherein the strobe signal generating unit is configured to provide a plurality of strobe signals evenly spaced in time within the time boundary.

11. A method for determining an eye mask of a device under test (DUT) that is configured to receive a data stream input signal having an added threshold signal level and output a data stream output signal, the method comprising following steps:
    receiving the data stream output signal;
    evaluating the received data stream output signal to provide an evaluation result;
    iteratively adjusting the threshold signal level in response to the evaluation result by a level and time evaluation unit until the evaluation indicates an error condition,
    wherein the threshold signal level is provided by a thermal noise generation element coupled to a variable gain amplifier.

12. The method of claim 11, wherein iteratively adjusting the threshold signal level comprises increasing an initial threshold level at a fixed increment until a first error condition occurs, then decreasing the initial threshold level at a fixed decrement until a second error condition occurs; or adjusting the threshold signal level comprises decreasing the initial threshold level at a fixed decrement until the error condition occurs, then increasing the initial threshold level at a fixed increment until the error condition occurs.

13. The method of claim 12, further comprising:
    storing a value of a last incremented threshold level associated with the first error condition and a value of a last decremented threshold level associated with the second error condition in a corresponding register, wherein a difference between the value of the last incremented threshold level and the value of the last decremented threshold level is a vertical height of the eye mask.

14. The method of claim 12, wherein the threshold signal level is adjusted between a minimum value and a maximum value, and the initial threshold level is a midpoint of the minimum value and the maximum value.

15. The method of claim 11, further comprising:
strobing the data stream output signal to determine a time boundary of the eye mask.

16. The method of claim 15, wherein strobing the data stream output signal comprising concurrently providing a plurality of strobe signals in a vicinity of a front edge and a back edge of an unit interval of the data stream output signal.

17. The method of claim 15, wherein strobing the data stream output signal comprising sequentially providing a strobe signal at an equal time interval from a front edge to a back edge of an unit interval of the data stream output signal.

18. The method of claim 11, wherein the threshold signal level comprises a level threshold value and a time threshold value, the level and time evaluation unit comprises a level evaluation unit configured to evaluate the data stream output signal with the level threshold value and output a first evaluation result, and a time evaluation unit configured to evaluate the data stream output signal with the time threshold value and output a second evaluation result; and
adjusting the threshold signal level comprises incrementing the level threshold value at a fixed increment, or decrementing the level threshold value at a fixed decrement.

* * * * *